(12) United States Patent
Tomoda et al.

(10) Patent No.: US 7,319,052 B2
(45) Date of Patent: *Jan. 15, 2008

(54) ALLOYING METHOD, AND WIRING FORMING METHOD, DISPLAY DEVICE FORMING METHOD, AND IMAGE DISPLAY UNIT FABRICATING METHOD

(75) Inventors: Katsuhiro Tomoda, Kanagawa (JP); Toyoharu Ohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 352 days.

This patent is subject to a terminal disclaimer.

(21) Appl. No.: 11/103,101

(22) Filed: Apr. 11, 2005

(65) Prior Publication Data

US 2005/0181601 A1    Aug. 18, 2005

Related U.S. Application Data

(63) Continuation of application No. 10/341,682, filed on Jan. 14, 2003, now Pat. No. 6,878,574.

(30) Foreign Application Priority Data

Jan. 17, 2002 (JP) .............................. 2002-009154
Dec. 13, 2002 (JP) .............................. 2002-362214

(51) Int. Cl.
    *H01L 21/82* (2006.01)
(52) U.S. Cl. ............... 438/128; 438/662; 257/E21.122; 257/E21.591
(58) Field of Classification Search ................. 438/128, 438/662; 257/E21.122, E21.591
    See application file for complete search history.

(56) References Cited

U.S. PATENT DOCUMENTS 4,359,486 A    11/1982    Patalong et al.
4,526,624 A    7/1985     Tombrello et al.
5,438,241 A    8/1995     Zavracky et al.
5,834,327 A    11/1998    Yamazaki et al.
5,989,944 A    11/1999    Yoon
6,030,849 A    2/2000     Hasegawa et al.
6,110,813 A    8/2000     Ota et al.

(Continued)

FOREIGN PATENT DOCUMENTS

| JP | 56-064480 | 1/1981 |
| JP | 57-72322 | 5/1982 |
| JP | 61-231730 | 10/1986 |
| JP | 61-231737 | 10/1986 |

*Primary Examiner*—Michael Lebentritt
*Assistant Examiner*—Stanetta Isaac
(74) *Attorney, Agent, or Firm*—Robert J. Depke; Rockey, Depke & Lyons, LLC.

(57) ABSTRACT

An alloying method includes the steps of forming a metal layer on a semiconductor having been transferred to a material having a low thermal conductivity, and alloying an interface between the semiconductor and the metal layer by irradiating the interface with a laser beam having a wavelength absorbable in at least one of the semiconductor and the metal layer. The irradiation energy of the laser beam is set in a range of 20 to 100 mJ/cm$^2$. The material having a low thermal conductivity is a resin or amorphous silicon. According to the alloying method using laser irradiation, since the entire semiconductor is not heated and only a necessary portion is locally heated, the necessary portion can be readily alloyed to be converted into an ohmic contact without exerting adverse effect on characteristics of the semiconductor device. In the case of previously transferring a semiconductor to a material having a low thermal conductivity, for example, into a resin, and irradiating an interface between the semiconductor and an electrode with a laser beam, the interface between the semiconductor and the electrode can be alloyed at a low temperature, to lower the irradiation energy of the laser beam.

1 Claim, 24 Drawing Sheets

U.S. PATENT DOCUMENTS

| | | |
|---|---|---|
| 6,111,277 A | 8/2000 | Ikeda |
| 6,204,079 B1 | 3/2001 | Aspar et al. |
| 6,252,261 B1 | 6/2001 | Usui et al. |
| 6,274,889 B1 | 8/2001 | Ota et al. |
| 6,277,711 B1 | 8/2001 | Wu |
| 6,316,357 B1 | 11/2001 | Lin et al. |
| 6,403,451 B1 | 6/2002 | Linthicum et al. |
| 6,576,571 B2 | 6/2003 | Biwa et al. |
| 6,583,445 B1 | 6/2003 | Reedy et al. |
| 6,586,778 B2 | 7/2003 | Gehrke et al. |
| 6,610,144 B2 | 8/2003 | Mishra et al. |
| 6,613,610 B2 | 9/2003 | Iwafuchi et al. |
| RE38,466 E | 3/2004 | Inoue et al. |

LASER

LASER

F I G. 5
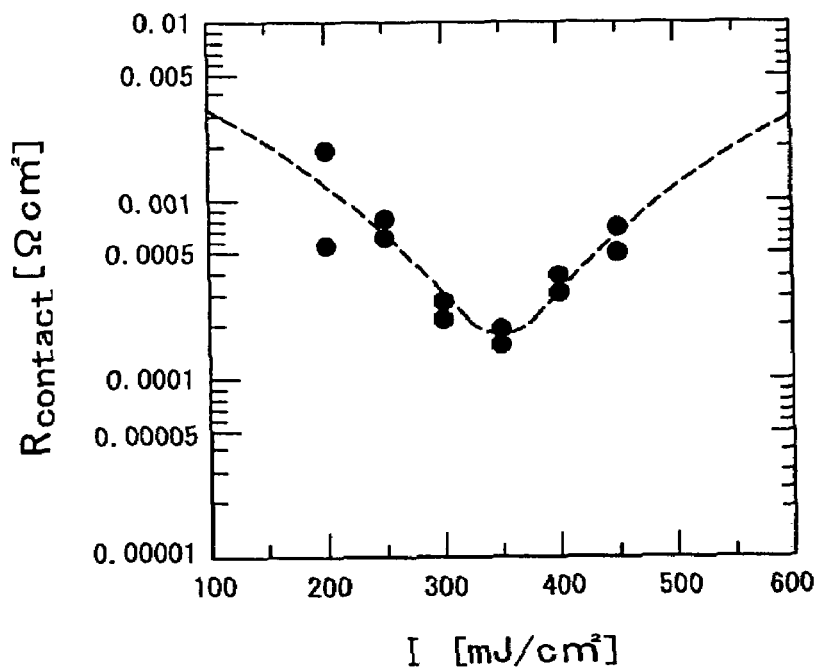
F I G. 6
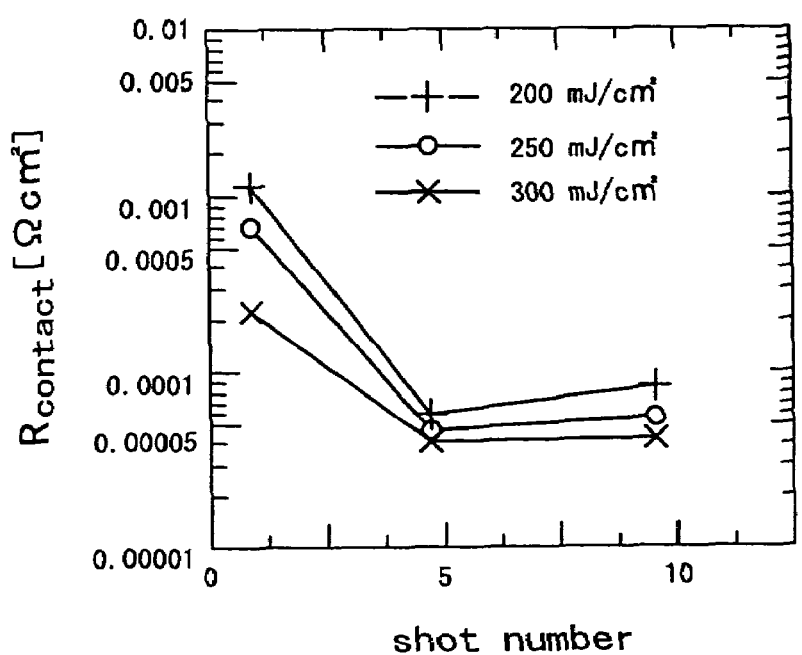

NOMARSKI OBSERVATION

OBSERVATION BY TRANSMITTED LIGHT FROM BACK SIDE

O₂ PLASMA

LASER

F I G. 3 1
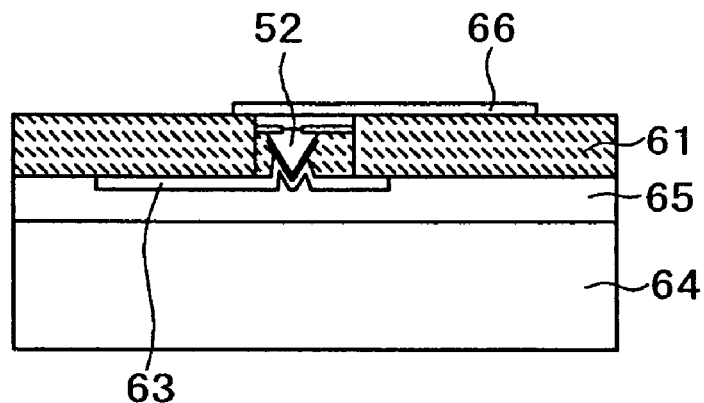
F I G. 3 2
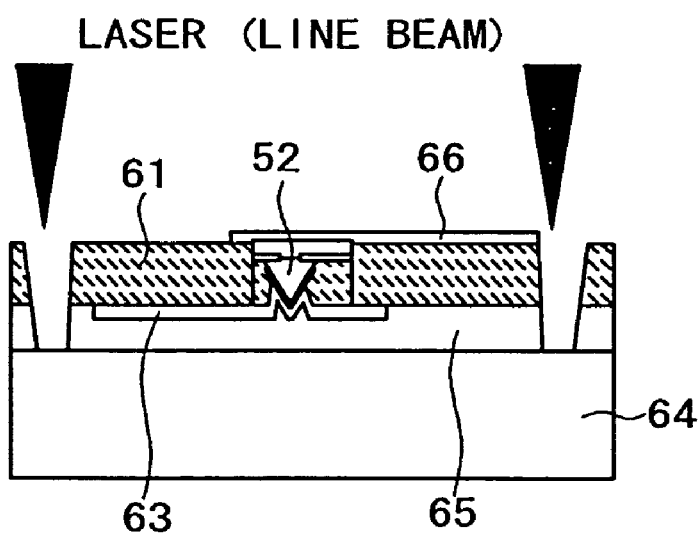

ALLOYING METHOD, AND WIRING FORMING METHOD, DISPLAY DEVICE FORMING METHOD, AND IMAGE DISPLAY UNIT FABRICATING METHOD

The present application is a continuation of U.S. application Ser. No. 10/341,682, now U.S. Pat. No. 6,878,574, filed Jan. 14, 2003, which claims priority to Japanese Patent Application No. JP2002-009154, filed Jan. 17, 2002, and Japanese Patent Application No. JP2002-362214, filed Dec. 13, 2002, all of which are incoroprated herein by reference. The present application claims priority to these previously filed applications.

BACKGROUND OF THE INVENTION

The present invention relates to a method of alloying an interface between a semiconductor and a metal layer, thereby forming an ohmic contact, and to a wiring forming method, a display unit forming method, and an image display unit fabricating method using the alloying method.

In the case of forming a metal layer as an electrode on a semiconductor device, it is required to convert a portion, being in contact with the semiconductor device, of the electrode into an ohmic contact to the semiconductor device. The conversion of a portion of an electrode into an ohmic contact has been typically performed by thermally alloying the portion of the electrode with the semiconductor device. For example, in the case of converting a portion, being in contact with an n-GaAs layer of a semiconductor device, of a contact metal AuGe/Ni/Au into an ohmic contact, the semiconductor device is heated at 420° C. for about one minute, to alloy the portion of the contact metal with the n-GaAs layer of the semiconductor device.

In the case of forming an ohmic contact by the so-called thermal alloying technique as described above, since the entire semiconductor device is heated, characteristics of the semiconductor device may be degraded. For example, to alloy an interface between the n-GaAs layer and the contact metal AuGe/Ni/Au for converting the interface into an ohmic contact, as described above, it is required to the entire semiconductor device at 420° C. for about one minute. In this case, if the n-GaAs layer is directly formed on a GaAs substrate, there is no problem; however, if an epitaxial layer not withstanding the above heating temperature is formed under the n-GaAs layer, or if an insulating film made from a resin or the like is formed before formation of a contact metal, there may occur a problem that device characteristics may be degraded by the thermal alloying process.

In view of the foregoing, an alloying process using laser irradiation has been proposed, for example, in Japanese Patent Laid-open No. Sho 57-72322. The alloying process using laser irradiation, which allows local heating, is expected to extend the application range and reduce degradation of the performance of a semiconductor device. The alloying process using laser irradiation, however, has problems that the irradiation of a laser beam having a high energy may cause abrasion of the surface of a metal and a semiconductor and damage the inner structure of a device, and that the irradiation of a laser beam having a high energy required for alloying limits an irradiation area, to reduce the throughput, thereby increasing the production cost.

SUMMARY OF THE INVENTION

An object of the present invention is to provide an alloying method capable of readily alloying only a necessary portion so as to convert the necessary portion into an ohmic contact without degrading characteristics of the semiconductor device.

Another object of the present invention is to provide an alloying method capable of selectively alloying only a necessary portion, thereby improving the efficiency of the alloying step.

A further object of the present invention is to provide a method capable of forming desirable wiring portions, a method of forming desirable display devices, and a method of fabricating a desirable image display unit, each of which uses the alloying method.

To achieve the above objects, according to a first aspect of the present invention, there is provided an alloying method including the steps of: forming a metal layer on a semiconductor having been transferred to a material having a low thermal conductivity; and alloying an interface between the semiconductor and the metal layer by irradiating the interface between the semiconductor and the metal layer with a laser beam having a wavelength absorbable in at least one of the semiconductor and the metal layer.

The alloying method of the present invention is performed by irradiating an interface between a semiconductor and a metal layer with a laser beam having a wavelength absorbable in either the semiconductor or the metal layer, whereby the interface absorbing the laser beam is heated to be alloyed. In the alloying process using laser irradiation, the entire semiconductor is not heated, but only a portion required to be alloyed (only the outermost surface of the semiconductor) is locally heated. With respect to such an alloying method using laser irradiation, according to the present invention, the semiconductor is previously transferred to a material having a low thermal conductivity, for example, into a resin and a metal layer is formed on the semiconductor, and then an interface between the semiconductor and the metal layer is irradiated with a laser beam, to be thus alloyed. Accordingly, the diffusion of heat caused by laser irradiation becomes slow, and thereby the substantial heating time becomes very long. The longer the heating time, the lower the alloying temperature. As a result, it is possible to set the irradiation energy of a laser beam to a low value and hence to eliminate abrasion of the surface of a metal and a semiconductor and also eliminate damaging of the inner structure of the semiconductor, and further to improve the throughput by increasing the irradiation area and hence to significantly reduce the production cost.

According to a second aspect of the present invention, there is provided a wiring forming method including the steps of: transferring a semiconductor device having been formed on a semiconductor substrate to a material having a low thermal conductivity, and removing the semiconductor substrate from the semiconductor device; forming, as a wiring portion, a metal layer being in contact with the semiconductor device; and alloying an interface between the semiconductor device and the wiring portion by irradiating the interface between the semiconductor device and the wiring portion with a laser beam having a wavelength absorbable in at least one of the semiconductor device and the wiring portion.

With this configuration, it is possible to form a desirable ohmic contact to a semiconductor device without damaging the semiconductor device.

According to a third aspect of the present invention, there is provided a method of forming a display device, including the steps of: forming, after a light emitting device made from a semiconductor is buried in a resin, an electrode composed of a metal layer on the surface of the resin; and alloying an interface between the light emitting device and the electrode by irradiating the interface between the light emitting device and the electrode with a laser beam having a wavelength absorbable in at least one of the semiconductor and the electrode.

With this configuration, since a desirable ohmic contact can be formed between a device and an electrode without damaging the device, it is possible to provide a display device having an excellent performance.

According to a fourth aspect of the present invention, there is provided a method of fabricating an image display unit in which display devices in the form of chips obtained by burying light emitting devices in a resin are arrayed in a matrix, the method including: a first transfer step of transferring light emitting devices having been arrayed on a first substrate to a temporarily holding member and holding the light emitting devices thereon in a state that the light emitting devices are enlargedly spaced from each other with a pitch larger than an array pitch of the light emitting devices on the first substrate; a second transfer step of transferring the light emitting devices having been held on the temporarily holding member to a second substrate in a state that the light emitting devices are more enlargedly spaced from each other with a pitch larger than the array pitch of the light emitting devices on the temporarily holding member; and a wiring forming step of forming a wiring portion connected to each of the light emitting devices; wherein the method further includes: an electrode forming step of forming, after each of the light emitting devices made from a semiconductor is buried in a resin, an electrode composed of a metal layer on the surface of the resin; and an alloying step of alloying an interface between the light emitting device and the electrode by irradiating the interface between the light emitting device and the electrode with a laser beam having a wavelength absorbable in at least one of the semiconductor and the electrode.

With this configuration, since a desirable ohmic contact can be formed between a device and an electrode without damaging the device, it is possible to provide an image display unit having an excellent performance.

BRIEF DESCRIPTION OF THE DRAWINGS

Other features and advantages of the present invention will be apparent from the following description taken in conjunction with the accompanying drawings wherein:

FIGS. 2A to 2D are schematic sectional views showing one example of a process of forming electrodes on the micro LED, wherein FIG. 2A shows a p-electrode forming step, FIG. 2B shows a laser abrasion step, FIG. 2C shows an n-electrode forming step, and FIG. 2D shows an alloying step;

FIG. 5 is a characteristic diagram showing a relationship between the irradiation energy of an YAG laser beam and a contact resistance;

FIG. 6 is a characteristic diagram showing a relationship between the number of shots of irradiation of the YAG laser beam and a contact resistance;

FIG. 31 is a schematic sectional view showing a cathode side electrode pad forming step;

FIG. 32 is a schematic sectional view showing a laser dicing step;

DETAILED DESCRIPTION OF THE PREFERRED EMBODIMENTS

Hereinafter, an alloying method, a wiring forming method, a display device forming method, and an image display unit fabricating method according to the present invention will be described with reference to the drawings.

Embodiments of the alloying method and the wiring forming method according to the present invention will be first described. In these embodiments, an electrode is alloyed with a micro LED representative of a semiconductor device by using the alloying method of the present invention.

Figure 1:
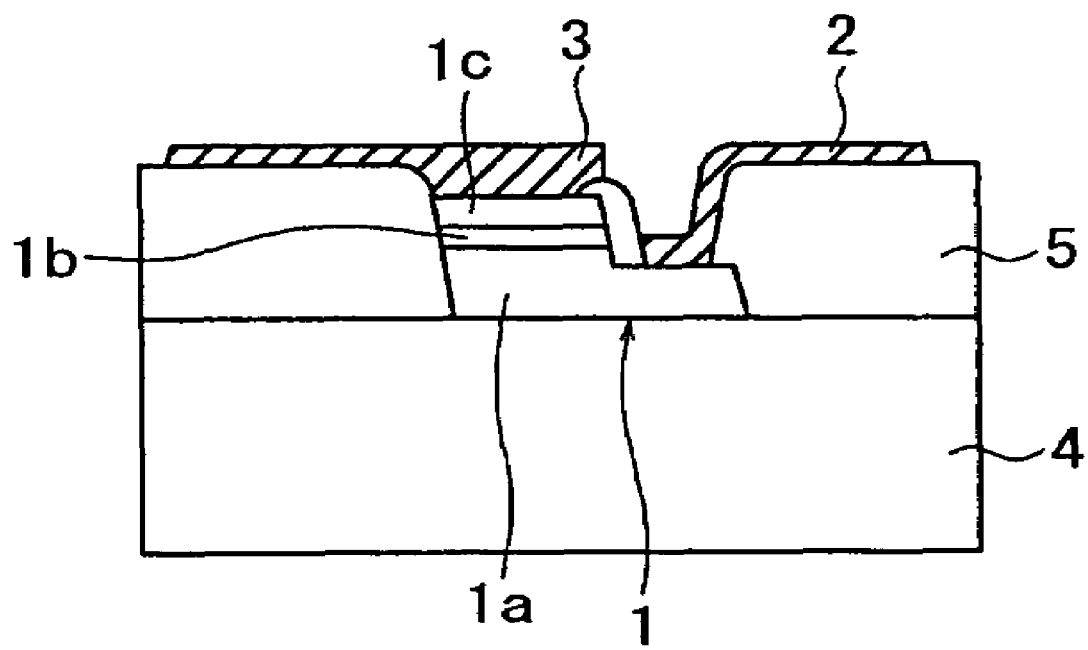
FIG. 1 is a schematic sectional view showing one structure example of a micro LED.

As shown in FIG. 1, a micro LED 1 is composed of an n-cladding layer 1a, an active layer 1b, and a p-cladding layer 1c, wherein an n-electrode 2 is connected to the n-cladding layer 1a and a p-electrode 3 is connected to the p-cladding layer 1c.

In general, the n-electrode 2 and the p-electrode 3 are formed, as shown in FIG. 1, by forming an insulating layer 5 so as to cover the micro LED 1 on a GaAs substrate 4, and providing openings in portions, corresponding to the n-cladding layer 1a and the p-cladding layer 1c, of the insulating layer 5, forming metal layers such that the metal layers are connected to the n-cladding layer 1a and the p-cladding layer 1c through the openings, and patterning the metal layers into the n-electrode 2 and the p-electrode 3.

In the case of extracting both the n-electrode 2 and the p-electrode 3 on the same surface side as described above, however, the metal layers must be patterned at a high accuracy. Accordingly, in this embodiment, as will be described below, there is adopted a structure that the n-electrode 2 and the p-electrode 3 are extracted on the opposed surface sides of the micro LED 1 in order to simplify the patterning of metal layers into the n-electrode 2 and the p-electrode 3.

The formation of such electrodes (n-electrode 2 and the p-electrode 3) on the opposed surface sides of the micro LED 1 and the process of alloying the electrodes with the micro LED 1 will be described with reference to FIGS. 2A to 2D.

Figure 2A:
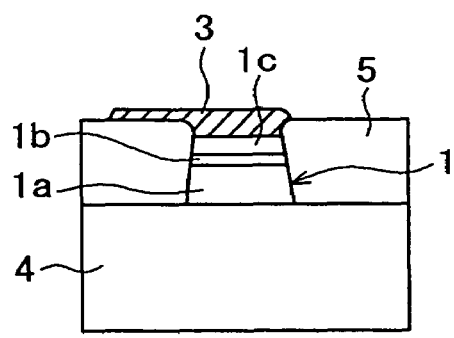

As shown in FIG. 2A, the insulating layer 5 is formed so as to cover the micro LED 1 on the GaAs substrate 4. An opening is formed in a portion, corresponding to the p-cladding layer 1c, of the insulating layer 5, and a metal layer is formed on the insulating layer 5 so as to be connected to the p-cladding layer 1c through the opening. The metal layer is then patterned into the p-electrode 3 as shown in the figure. In this case, since the metal layer formed on one side of the micro LED 1 is patterned only into the p-electrode 3, it is not required to pattern the metal layer at a high accuracy.

A portion, being connected to the micro LED 1 (particularly, the p-cladding layer 1c), of the p-electrode 3 is required to be converted into an ohmic contact to the micro LED 1.

In this embodiment, such conversion of the portion of the p-electrode 3 into an ohmic contact to the micro LED 1 is performed by the alloying method using laser irradiation according to the present invention.

According to the alloying method using laser irradiation, only a specific region at which a portion of the p-electrode 3 is in contact with the p-cladding layer 1c is irradiated with laser beams, to be heated. At this time, the laser beams used to irradiate the above specific region are specified to have a wavelength absorbable in a metal forming the p-electrode 3 and/or the p-cladding layer 1c. With this configuration, only the specific region irradiated with the laser beams is heated to be alloyed.

Figure 2B:
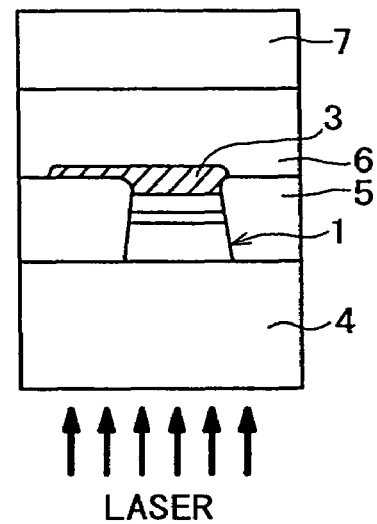

After the portion of the p-electrode 3 is converted into the ohmic contact to the p-cladding layer 1c by the alloying method, as shown in FIG. 2B, a transfer substrate 7 provided with an adhesive layer 6 made from a material having a low thermal conductivity is overlapped to the micro LED 1 side of the GaAs substrate 4, and the GaAs substrate 4 is peeled from the micro LED 1 by laser abrasion caused by laser irradiation from the back side of the GaAs substrate 4, whereby the micro LED 1 is transferred to the transfer substrate 7. The transfer substrate 7 may be made from sapphire. The material having a low thermal conductivity may be selected from a resin such as an epoxy based resin, an ultraviolet ray curing resin, or a silicon resin, and a metal such as amorphous silicon.

Figure 2D:
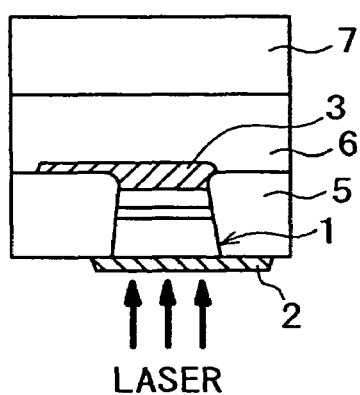
Figure 2C:
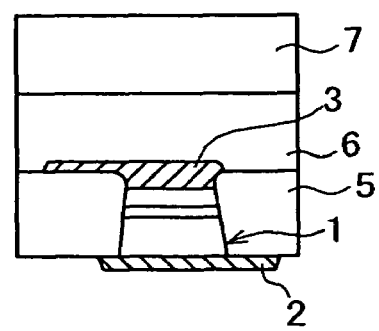

After the micro LED 1 is transferred to the transfer substrate 7, as shown in FIG. 2C, a metal layer is formed on the back surface of the micro LED 1 and is patterned into the n-electrode 2. The metal layer can be formed by vapor deposition; however, since the micro LED 1 is surrounded by the adhesive layer 6 and the insulating layer 5, the n-electrode 2 patterned from the metal layer cannot be alloyed with the micro LED 1 by using an ordinary thermal alloying method which is performed by heating the entire structure at a temperature of about 420° C. Accordingly, as shown in FIG. 2D, only a region at which a portion of the n-electrode 2 is in contact with the n-cladding layer 1a is irradiated with laser beams having a wavelength absorbable in at least one of the n-electrode 2 and the n-cladding layer 1a, to be thus heated, whereby the portion of the n-electrode 2 is alloyed with the n-cladding layer 1a, to be converted into an ohmic contact to the n-cladding layer 1a.

As described above, according to this embodiment, after a semiconductor substrate (GaAs substrate 4) having a high thermal conductivity is removed and only a necessary semiconductor device portion is transferred to a layer made from a material having a low thermal conductivity such as a resin (adhesive layer 6), only a region at which an electrode is in contact with the semiconductor device is irradiated with laser beams, to be alloyed. In this case, since the diffusion of heat caused by laser irradiation becomes slow, the heating time becomes substantially very longer. The longer the heating time, the lower the alloying temperature. This is advantageous in reducing the energy of the laser beams required for laser irradiation. The reduction of the energy of the laser beams required for laser irradiation makes it possible to eliminate abrasion of the surface of a metal and a semiconductor constituting the semiconductor device and also eliminate damaging of the inner structure of the semiconductor device, and also to easily increase an irradiated area and hence to reduce the production cost by, for example, increasing the throughput.

Concretely, in the case of alloying an electrode with a semiconductor device in a state being fixed to a semiconductor substrate, a laser energy in a range of about 200 to 400 mJ/cm$^2$ is required, whereas in the case of alloying an electrode with a semiconductor device in a state after being transferred to a resin layer such as the adhesive layer 6, only a laser energy of about 20 to 100 mJ/cm² is required. To be more specific, in the latter case, the electrode can be alloyed with the semiconductor device to be converted into an ohmic contact to the semiconductor device by laser beams having a laser energy of about 20 to 100 mL/cm².

Figure 3:
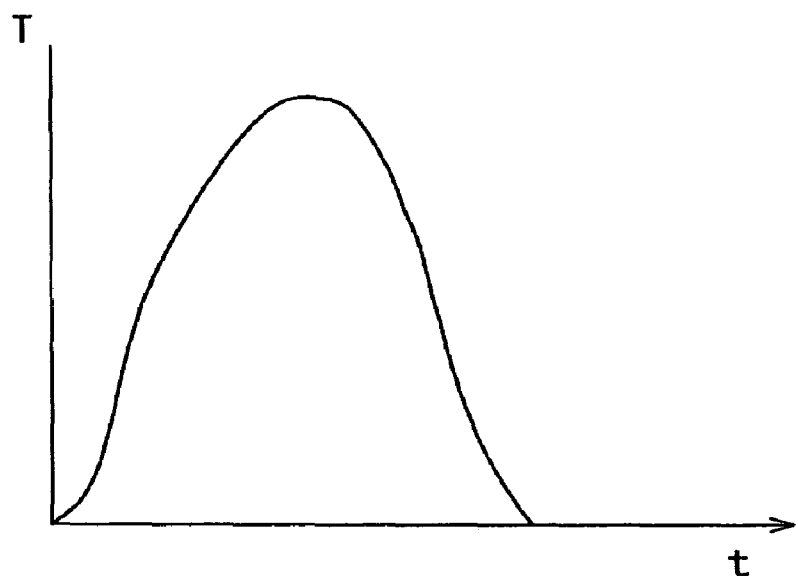
FIG. 3 is a characteristic diagram showing a change in heating temperature with elapsed time at the time of pulse laser irradiation before removal of a GaAs substrate.

FIG. 3 is a diagram showing a change in heating temperature with elapsed time in the case of irradiating the micro LED 1 with pulse laser beams, for example, pulse YAG laser beams (irradiation energy: 300 mJ/cm²) before the GaAs substrate 4 is removed from the micro LED 1 by laser abrasion. As shown in this figure, in the state that the GaAs substrate 4 is present, the heating time is as small as about several 10 nanoseconds.

Figure 4:
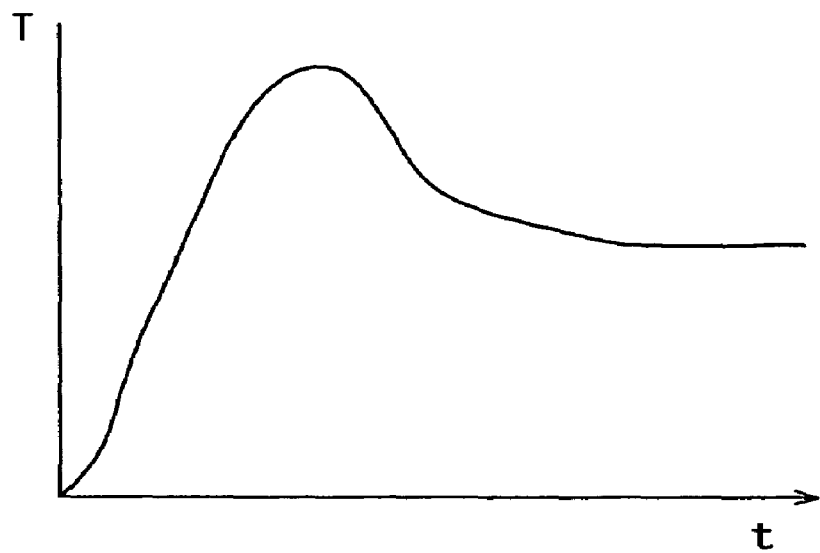
FIG. 4 is a characteristic diagram showing a change in heating temperature with elapsed time at the time of pulse laser irradiation after transfer of the device to an adhesive layer.

FIG. 4 is a diagram showing a change in heating temperature with elapsed time in the case of irradiating the micro LED 1 with pulse laser beams, for example, pulse YAG laser beams (irradiation energy: 100 mJ/cm²) after the micro LED 1 is transferred to the adhesive layer 6. As shown in this figure, in the state that the GaAs substrate 4 is not present, the substantial irradiation time becomes as long as about several microseconds.

As described above, to alloy a contact metal (electrode) with a semiconductor device by laser irradiation, the setting of the energy of laser beams used for laser irradiation becomes important. For example, in the case of alloying a contact metal with an n-GaAs layer formed on a GaAs substrate by irradiation of YAG laser beams (wavelength: 532 nm), when the laser irradiation is performed by one shot of the YAG laser beams, as shown in FIG. 5, the contact resistance ($R_{contact}$) is minimized at an irradiation energy of about 350 mJ/cm², while when the laser irradiation is performed by five or more shots of the YAG laser beams, as shown in FIG. 6, the contact resistance at each of the irradiation energies 200, 250, and 300 mJ/cm² is substantially reduced to the same level. It is to be noted that the five or more shots of irradiation may cause a problem associated with damaging of the contact metal.

Table 1 shows changes in contact resistance, metal damage, and GaAs damage depending on the power (irradiation energy) of the YAG laser beams and the number of shots of irradiation. The irradiation energy of 300 mJ/cm² is a level immediately before occurrence of abrasion. That is to say, if the irradiation energy is 300 mL/cm² or more, the GaAs damage occurs even by one shot of irradiation. Meanwhile, if the irradiation energy is set to be equal to or less than 250 mJ/cm², the contact resistance becomes insufficient unless the laser irradiation is repeated by five or more shots. As a result, it becomes apparent that in the case of alloying the contact metal with the n-GaAs layer formed on the GaAs substrate, there is no condition in which all of the contact resistance, the metal damage, and the GaAs damage become desirable. It is to be noted that the desirable result is shown by a mark ○ in Table 1.

On the contrary, in the case of removing the GaAs substrate by laser abrasion and transferring the semiconductor device to a resin layer, and then alloying the contact metal with the semiconductor device by irradiation of the YAG laser beams, there is a condition in which all of the contact resistance, the metal damage, and the GaAs damage become desirable.

Figure 7:
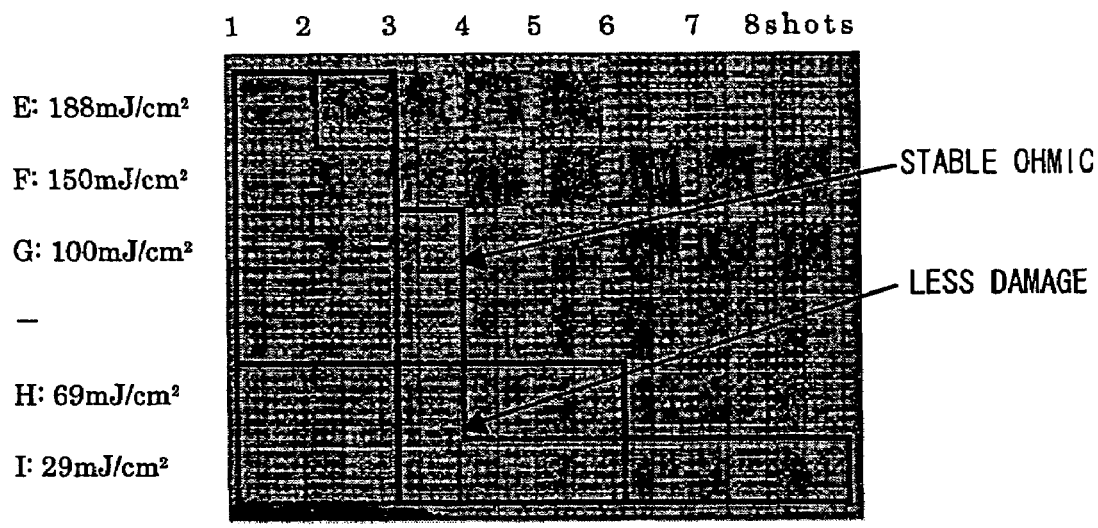
FIG. 7 is a photograph showing the result of Nomarski observation after laser irradiation for evaluating the resistance of a contact alloyed by laser irradiation.
Figure 8:
FIG. 8 is a photograph showing the result of observation by transmitted light from the back surface side after laser irradiation for evaluating the resistance of a contact alloyed by laser irradiation.

FIGS. 7 and 8 are photographs each showing the result of a test performed by forming an n-contact metal to a semiconductor device from which a GaAs substrate has been removed and alloying the n-contact metal with the semiconductor device by irradiation of YAG laser beams.

In this test, the boundary between the n-contact metal and the semiconductor device was irradiated with YAG laser beams having an irradiation energy ranging from 188 mJ/cm² (E) to 29 mJ/cm² (I) under a condition with a wavelength of 532 nm, a magnification of an UV lens (blue) of ×20, a frequency of 10 Hz, and an irradiation area of 150 μm×150 μm. In addition, a damage portion in the left half of each irradiation region shown in each of FIGS. 7 and 8 was etched after laser irradiation.

As is apparent from FIGS. 7 and 8, in the case of alloying a contact metal with a semiconductor device from a GaAs substrate has been removed, it is possible to obtain a stable ohmic contact with less damage by irradiation of one shot of YAG laser beams having an irradiation energy of 100 to 150 mJ/cm², or by irradiation of three to five shots of YAG laser beams having an irradiation energy of 29 mJ/cm².

Figure 9:
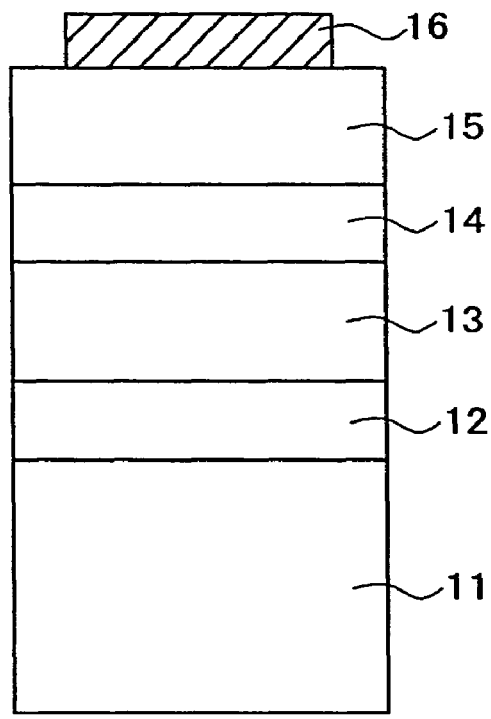
FIG. 9 is a schematic sectional view showing one example of a semiconductor device having a low temperature growth layer.

The above-described alloying method using laser irradiation is particularly effective to alloy a contact metal (electrode) to a semiconductor device having a low temperature growth layer formed by epitaxial growth at a low epitaxial temperature. FIG. 9 shows a semiconductor device having a structure that a first epitaxial growth layer 12 (epitaxial temperature: 500° C.), a second epitaxial growth layer 13 (epitaxial temperature: 400° C.), a third epitaxial growth layer 14 epitaxial temperature: 550° C.), and a fourth epitaxial growth layer 15 (epitaxial temperature; 520° C.) are stacked in this order on a substrate 11. For this semiconductor device, since the epitaxial temperature of the second epitaxial growth layer 13 is as low as 400° C., it is impossible to thermally alloy a metal layer 16, which is formed as an electrode layer on the fourth epitaxial growth layer 15, with the epitaxial growth layer 15 at a temperature more than 400° C., for example, 420° C.; however, according to the alloying method using laser irradiation, since only the outermost surface of the semiconductor device, that is, the surface of the fourth epitaxial growth layer 15 is heated by laser irradiation, the metal layer 16 can be alloyed with the fourth epitaxial growth layer 15 without damaging the other layers, particularly, the second epitaxial growth layer 13.

TABLE 1

| | Contact Resistance | | | Metal Damage | | | GaAs Damage | | |
|---|---|---|---|---|---|---|---|---|---|
| | 1 shot | 5 shots | 10 shots | 1 shot | 5 shots | 10 shots | 1 shot | 5 shots | 10 shots |
| 200 mJ/cm² | X | ○ | ○ | ○ | X | X | ○ | ○ | ○ |
| 250 mJ/cm² | Δ | ○ | ○ | ○ | X | X | ○ | ○ | ○ |
| 300 mJ/cm² | ○ | ○ | ○ | ○ | X | X | Δ | Δ | Δ |
| 350 mJ/cm² | ○ | — | — | ○ | — | — | X | — | — |
| 400 mJ/cm² | ○ | — | — | Δ | — | — | X | — | — |
| 450 mJ/cm² | Δ | — | — | X | — | — | X | — | — |

According to the alloying method using laser irradiation, only a portion, being in contact with a semiconductor device, of a metal layer formed as an electrode layer can be selectively alloyed with the semiconductor device, to be thus converted into an ohmic contact to the semiconductor device. In other words, the portions, to be alloyed, of the metal layer can be patterned by selective laser irradiation.

Figure 10:
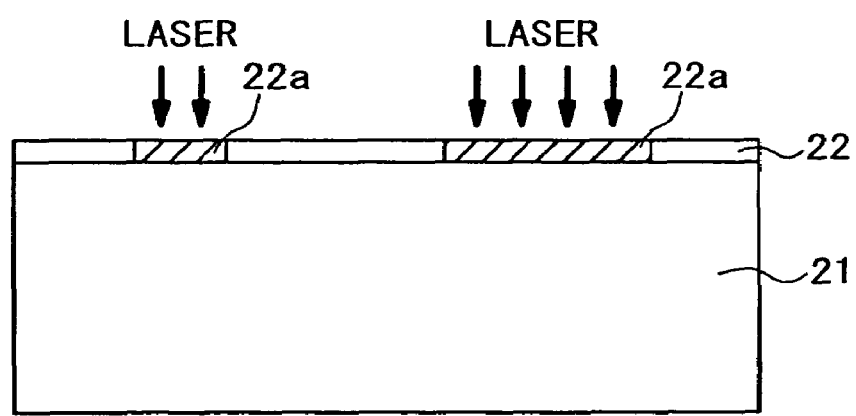
FIG. 10 is a sectional view showing one example in which portions, to be alloyed, of a metal layer is patterned by selective laser irradiation.

FIG. 10 shows one example in which portions, to be alloyed, of a metal layer is patterned by selective laser irradiation.

In a general wiring forming process, it is required to form a patterned contact metal on a semiconductor device, thermally alloy the contact metal with the semiconductor device, and form an insulating layer and a wiring pattern.

On the contrary, according to the alloying method using laser irradiation, as shown in FIG. 10, a metal layer 22 for forming a contact metal serving as a wiring metal is formed overall on the surface of a semiconductor device 21, and regions 22a to be converted into ohmic contacts are irradiated with laser beams to be alloyed with the semiconductor device 21. As a result, only the irradiated regions 22a become ohmic contacts allowing the flow of a current therethrough. The patterning of portions, to be alloyed, of a metal layer by selective laser irradiation is effective to reduce the number of steps as compared with the ordinary wiring forming process, and hence to reduce the production cost.

The above-described alloying method and wiring forming method can be applied to the display device forming method of the present invention performed by burying light emitting devices in a resin, to form resin-covered chips, and then forming electrodes on the surface of the resin of each of the resin-covered chips.

The display device forming method, and the image display unit fabricating method of the present invention using the display device forming method will be hereinafter described in detail.

In the case of an image display unit using, for example, light emitting diodes, the light emitting diodes are required to be arranged in such a manner as to be enlargedly spaced from each other. Various methods of arraying the light emitting diodes in such a manner that the devices are enlarged spaced from each other have been known, and in this embodiment, the image display unit fabricating method of the present invention will be described by example a so-called two-step enlarged transfer method.

The two-step enlarged transfer method is carried out by transferring devices, which are previously formed on a first substrate at a high density, to a temporarily holding member in such a manner that the devices are enlarged spaced from each other with a pitch larger than a pitch of the devices arrayed on the first substrate, and further transferring the devices held on the temporarily holding member to a second substrate in such a manner that the devices are enlargedly spaced from each other with a pitch larger than the pitch of the devices held on the temporarily holding member. Although two-step transfer is adopted in this embodiment, multi-step transfer such as three or more-step transfer can be adopted in accordance with a required enlargement ratio between the pitch of the devices arrayed on the first substrate and the pitch of the devices mounted on the second substrate.

Figure 11:
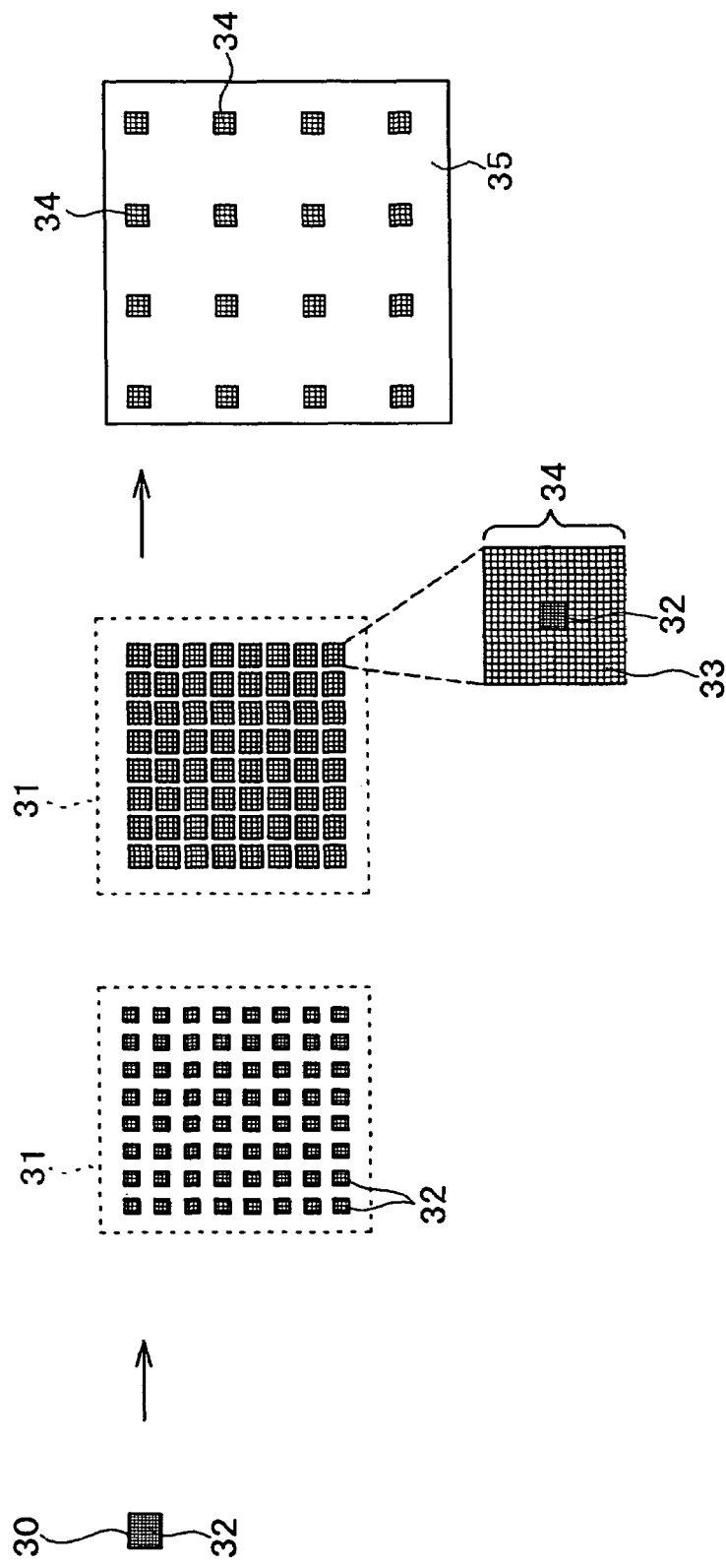
FIGS. 11A to 11D are typical views showing a method of arraying devices.
Figure 12:
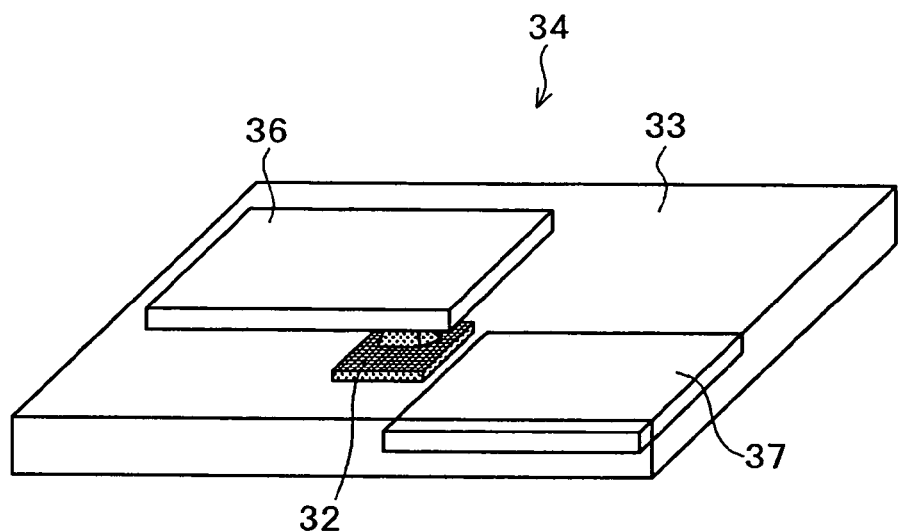
FIG. 12 is a schematic perspective view of a resin-covered chip.
Figure 13:
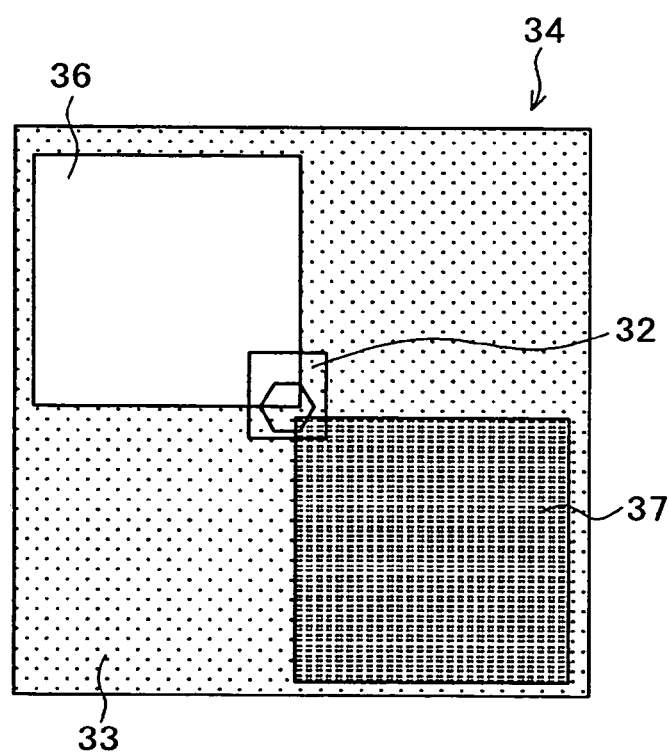
FIG. 13 is a schematic plan view of the resin-covered chip.

FIGS. 11A to 11D are views showing basic steps of the two-step enlarged transfer method. As shown in FIG. 11A, devices 32 such as light emitting devices are densely formed on a first substrate 30. By densely forming devices on a substrate, the number of the devices formed per each substrate can be increased, to reduce a production cost of a final product using the devices. The first substrate 30 may be selected from various substrates on each of which devices can be formed, for example, a semiconductor wafer, a glass substrate, a quartz glass substrate, a sapphire substrate, and a plastic substrate. The devices 32 may be directly formed on the first substrate 30, or may be formed once on another substrate and then transferred and arrayed on the first substrate 30.

As shown in FIG. 11B, the devices 32 are transferred from the first substrate 30 to a temporarily holding member 31 shown by a broken line in the figure and held thereon. On the temporarily holding member 31, the adjacent two of the devices 32 are enlargedly spaced from each other so that the devices 32 are arrayed in a matrix as shown in the figure. More specifically, the devices 32 are transferred to the temporarily holding member 31 in such a manner as to be enlargedly spaced from each other not only in the x-direction but also in the y-direction perpendicular to the x-direction. The enlarged distance between the adjacent two of the devices 32 is not particularly limited, but may be set, for example, in consideration of formation of a resin portion covering each of the devices 32 and also formation of electrode pads on each resin portion in the subsequent steps. The devices 32 on the first substrate 30 can be all transferred from the first substrate 30 to the temporarily holding member 31 in such a manner as to be enlargedly spaced from each other. In this case, the size of the temporarily holding member 31 in each of the x-direction and the y-direction may be equal to or more than a value obtained by multiplying the enlarged distance by the number of those, arrayed in each of the x-direction and the y-direction, of the devices 32 arrayed in the matrix on the temporarily holding member 31. Alternatively, part of the devices 32 on the first substrate 30 may be transferred to the temporarily holding member 31 in such a manner as to be enlargedly spaced from each other.

After such a first transfer step, as shown in FIG. 1C, each of the devices 32 enlargedly spaced from each other on the temporarily holding member 31 is covered with a resin, and electrode pads are formed on the resin covering the device 32. The reason why each device 32 is covered with the resin is to facilitate the formation of the electrode pads for the device 32 and to facilitate the handling of the device 32 in the subsequent second transfer step. To prevent occurrence of a wiring failure in a final wiring step performed after the second transfer step (which will be described later), the electrode pads are formed into relatively large sizes. It is to be noted that the electrode pads are not shown in FIG. 1C.

The enlarged partial view in FIG. 11C shows a resin-covered chip 34 thus formed by covering each of the devices 32 with a resin 33. As seen from top, the device 32 is located at an approximately central portion of the resin-covered chip 34; however, the device 32 may be located at a position offset to one side or a corner of the resin-covered chip 34.

As shown in FIG. 11D, a second transfer step is carried out, in which the devices 32 arrayed in the matrix on the temporarily holding member 31 in the form of the resin-covered chips 34 are transferred to a second substrate 35 in such a manner as to be more enlargedly spaced from each other. Even in the second transfer step, adjacent two of the devices 32 in the form of the resin-covered chips 34 are enlargedly spaced from each other so that the devices 32 are arrayed in a matrix shown in the figure. More specifically, the devices 32 are transferred in such a manner as to be enlargedly spaced from each other not only in the x-direction but also in the y-direction perpendicular to the x-direction. If positions of the devices 32 arrayed on the second substrate 35 in the second transfer step correspond to positions of pixels of a final product such as an image display unit, a pitch of the devices 32 arrayed on the second substrate 35 in the second transfer step becomes about integer times an original pitch of the devices 32 arrayed on the first substrate 30. Assuming that an enlargement ratio of the pitch of the devices 32 held on the temporarily holding member 31 to the pitch of the devices 32 arrayed on the first substrate 30 is taken as "n" and an enlargement ratio of the pitch of the devices 32 arrayed on the second substrate 35 to the pitch of the devices 32 held on the temporarily holding member 31 is taken as "m", a value E of the above-described about integer times is expressed by E=n×m.

The devices 32 in the form of the resin-covered chips 34, which are enlargedly spaced from each other on the second substrate 35, are then subjected to a wiring work. The wiring work is performed with care taken not to cause a connection failure by making use of the previously formed electrode pads and the like. If the devices 32 are light emitting devices such as light emitting diodes, the wiring work includes wiring to p-electrodes and n-electrodes.

In the above-described two-step enlarged transfer method shown in FIGS. 11A to 11D, each device 32 is covered with the resin and electrode pads are formed on the resin covering the device 32 by making use of the enlarged distance between adjacent two of the devices 32 after the first transfer, and wiring can be performed after the second transfer while suppressing the occurrence of a connection failure as much as possible by making use of the previously formed electrode pads and the like. As a result, it is possible to improve a production yield of an image display unit.

The two-step enlarged transfer method according to this embodiment, which includes the two enlarged transfer steps in each of which devices are enlargedly spaced from each other, has the following advantage: namely, by performing a plurality of such enlarged transfer steps in each of which devices are enlargedly spaced from each other, the number of transfer can be actually reduced.

It is now assumed that an enlargement ratio of the pitch of the devices 32 on the temporarily holding member 31 to the pitch of the devices 32 on the first substrate 30 is taken as 2 (n=2) and an enlargement ratio of the pitch of the devices 32 on the second substrate 35 and the pitch of the devices 32 on the temporarily holding member 31 is taken as 2 (m=2). In this case, the total enlargement ratio becomes 2×2=4. To realize the total enlargement ratio (=4), according to a one-step enlarged transfer method, the number of transfer (alignment) of the devices 32 from the first substrate 30 to the second substrate 35 becomes 16 (=$4^2$) times. On the contrary, to realize the same total enlargement ratio (=4), according to the two-step enlarged transfer method in this embodiment, the number of transfer (alignment) of the devices 32 from the first substrate 30 to the second substrate 35 is determined by simply adding the square of the enlargement ratio (=2) in the first transfer step, that is, 4 (=$2^2$) times to the square of the enlargement ratio (=2) in the second transfer step, that is, 4 (=$2^2$) times, and therefore, the number of transfer becomes 8 (=4+4) times. To be more specific, according to the two-step enlarged transfer method, to achieve the total enlargement ratio (transfer magnification) of n×m, the total number of transfer becomes ($n^2+m^2$) times, whereas according to the one-step enlarged transfer method, to achieve the same total enlargement ratio (transfer magnification) of n×m, the number of transfer becomes $(n+m)^2 = n^2 + 2nm + m^2$. As a result, according to the two-step enlarged transfer method, the number of transfer can be made smaller than that according to the one-step enlarged transfer method by 2 nm times, thereby correspondingly saving the time and cost required for the production step. This becomes more significant as the total enlargement ratio becomes large.

In the two-step enlarged transfer method shown in FIGS. 11A to 11D, the device 32 is exemplified by a light emitting device; however, the present invention is not limited thereto. For example, the device 32 may be selected from a liquid crystal control device, a photoelectric transfer device, a piezoelectric device, a thin film transistor device, a thin film diode device, a resistance device, a switching device, a micro-magnetic device, and a micro-optical device, or be part of each of these devices or a combination of these devices.

In the above-described second transfer step, each light emitting device is handled in the form of a resin-covered chip, and is transferred from the temporarily holding member to the second substrate. Such a resin-covered chip will be described in detail with reference to FIGS. 10 and 11.

The resin-covered chip 34 is formed, as described above, by covering each of the light emitting devices 32 enlargedly spaced from each other with the resin 33, and in the second transfer step, the light emitting devices 32 are transferred in the form of the resin-covered chips 34 from the temporarily holding member to the second substrate. The resin-covered chip 34 is formed into an approximately flat plate shape having an approximately square principal plane. The shape of the resin-covered chip 34 is the shape of the resin 33 covering the light emitting device 32. More specifically, the resin-covered chips 34 are obtained by coating the overall surface of the temporarily holding member 31 so as to cover the devices 32 with a non-cured resin, curing the resin, and cutting edges of the cured resin 33 into square chips by dicing.

Electrode pads 36 and 37 are formed on front and back surfaces of the approximately flat plate shaped resin 33, respectively. These electrode pads 36 and 37 are each produced by forming a conductive layer made from a metal or polysilicon as a material for forming each of the electrode pads 36 and 37 overall on each of the front and back surfaces of the resin 33, and patterning the conductive layer into a specific electrode shape by photolithography. The electrode pads 36 and 37 are formed so as to be connected to a p-electrode and an n-electrode of the light emitting device 32, respectively. In this case, via-holes and the like may be formed in the resin 33 as needed. Since the wiring is formed on the electrode pads 36 and 37, the resin 33 is heated under a reduced pressure to sufficiently degas moisture or the like before the formation of the electrode pads 36 and 37.

In this embodiment, the electrode pads 36 and 37 are formed on the front and back surfaces of the resin-covered chip 34, respectively; however, they may be formed on either of the front and back surfaces of the resin-covered chip 34. Further, if the device is exemplified by a thin film transistor, since it has three electrodes, that is, a source, a gate, and a drain, three or more electrode pads may be formed. The reason why the electrode pads 36 and 37 are offset from each other in the horizontal direction is to prevent the electrode pads 36 and 37 from being overlapped to each other even in the case of forming a contact hole from above at the time of formation of final wiring. The shape of each of the electrode pads 36 and 37 is not limited to a square shape but may be any other shape.

The formation of such a resin-covered chip 34 is advantageous in that since the device 32 is covered with the flattened resin 33, the electrode pads 36 and 37 can be accurately formed on the flattened front and back surfaces of the resin 33, and the electrode pads 36 and 37 can be formed so as to extend to a region wider than the size of the device 32, thereby facilitating the handling of the device 32 at the time of transfer by an attracting jig in the second transfer step. As will be described later, since final wiring is performed after the second transfer step, a wiring failure can be prevented by performing wiring using the electrode pads 36 and 37 having relatively large sizes.

Figure 14A:
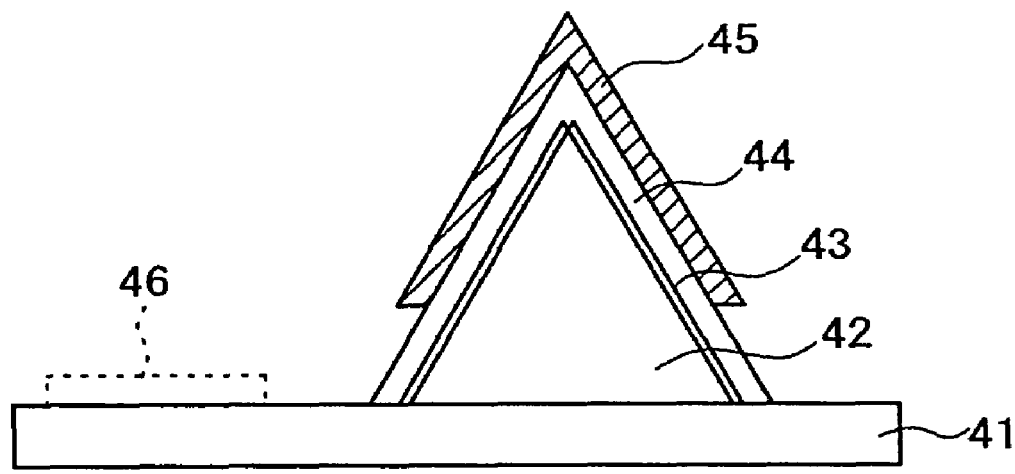
FIGS. 14A and 14B are a sectional view and a plan view showing one example of a light emitting device, respectively.
Figure 14B:
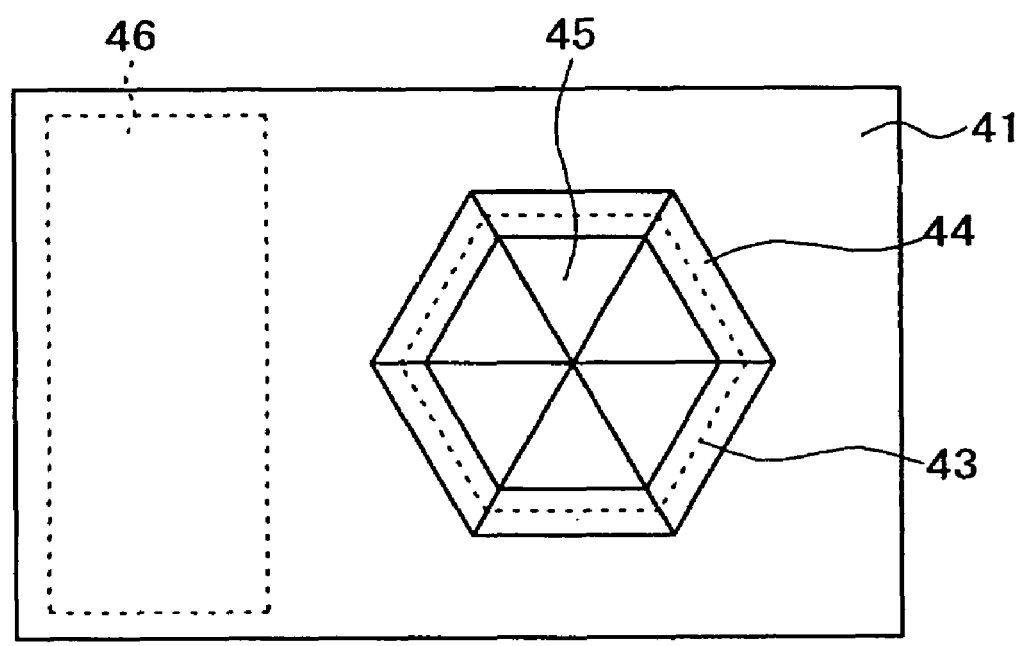

FIGS. 14A and 14B are a sectional view and a plan view of the structure of a light emitting device as one example of the device used for the two-step enlarged transfer method according to this embodiment, respectively.

The light emitting device is configured as a GaN based light emitting diode formed, for example, on a sapphire substrate by crystal growth. Such a GaN based light emitting diode has a feature that it can be easily separated from the sapphire substrate by laser irradiation. To be more specific, when an interface between the sapphire substrate and a GaN based crystal growth layer is irradiated with laser beams passing through the substrate, laser abrasion occurs at the interface, to cause peeling of the film at the interface due to vaporization of nitrogen (N) of GaN.

The structure of the GaN based light emitting diode will be described below. A hexagonal pyramid shaped GaN layer 42 is formed by selective growth on an underlying growth layer 41 made from a GaN based semiconductor. More specifically, an insulating film (not shown) is formed on the underlying growth layer 41, an opening is formed in the insulating layer, and the hexagonal pyramid shaped GaN layer 42 is formed by selective growth from the opening by, for example, an MOCVD process. The GaN layer 42 is doped with silicon, and if a C-plane of sapphire is used as a principal plane of the sapphire substrate used for crystal growth, the GaN layer 42 is grown into a pyramid shape covered with an S-plane (1-101) plane. The tilt S-plane portion of the GaN layer 42 functions as a cladding layer of a double-hetero structure. An InGaN layer 43 as an active layer is formed so as to cover the tilt S-plane of the GaN layer 42, and a magnesium-doped GaN layer 44 is formed on the InGaN layer 43. The magnesium-doped GaN layer 44 also functions as a cladding layer.

A p-electrode 45 and an n-electrode 46 are formed on such a light emitting diode. The p-electrode 45 is formed by vapor-depositing a metal material such as Ni/Pt/Au or Ni(Pd)/Pt/Au on the magnesium-doped GaN layer 44. The n-electrode 46 is formed by vapor-depositing a metal material such as Ti/Al/Pt/Au in the opening formed in the above-described insulating film (not shown). It is to be noted that if n-electrode extraction is performed from the back side of the underlying growth layer 41, the n-electrode 46 is not required to be formed on the front side of the underlying growth layer 41.

The GaN based light emitting diode having such a structure allows even emission of light of blue, and particularly, it can be relatively simply peeled from the sapphire substrate by laser abrasion, and therefore, can be selectively peeled from the sapphire substrate by selective irradiation of a laser beam. The GaN based light emitting diode may have a structure that an active layer be formed in a flat shape or a band shape, or may have a pyramid shaped structure that a C-plane is formed on an upper end portion. The light emitting device is not limited to the above-described GaN based light emitting diode but may be another nitride based light emitting device or a compound semiconductor device.

A concrete method of fabricating an image display unit using the two-step enlarged transfer method shown in FIGS. 11A to 11D will be described below. In addition, the GaN based light emitting diodes shown in FIGS. 14A and 14B are used as light emitting devices for the image display unit.

Figure 15:
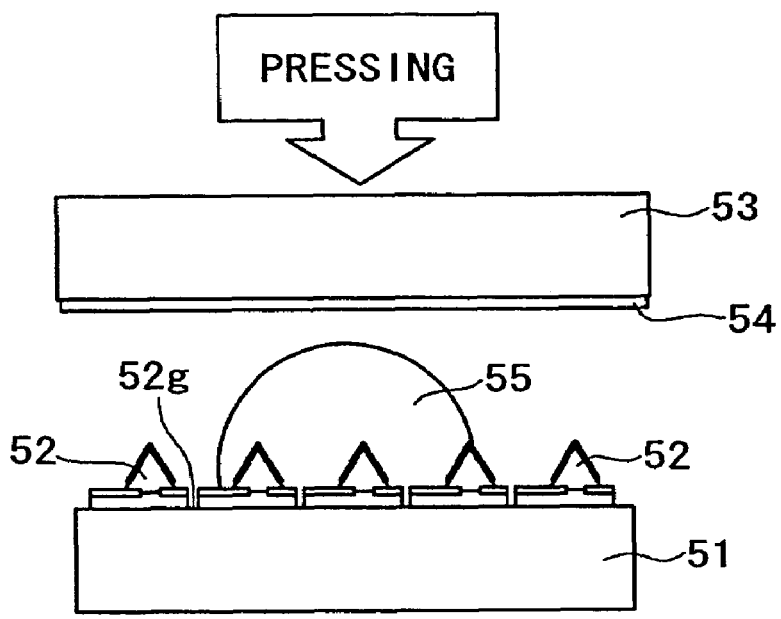
FIG. 15 is a schematic sectional view showing a first temporarily holding member joining step.
Figure 16:
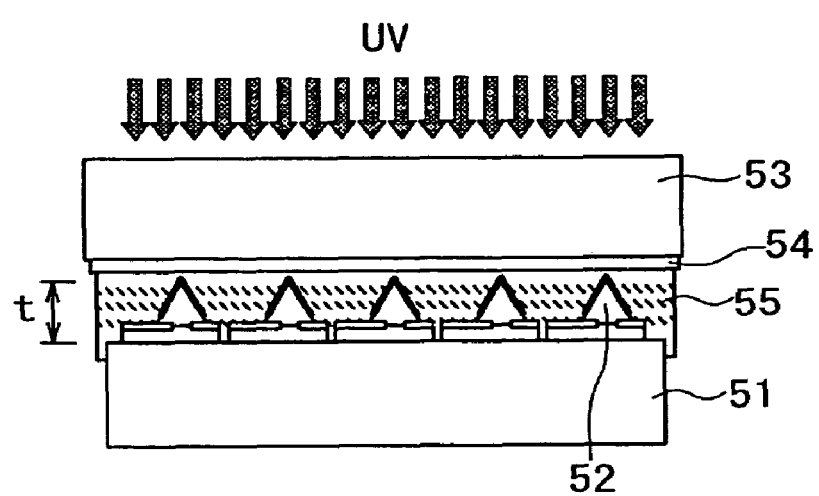
FIG. 16 is a schematic sectional view showing an UV-adhesive curing step.

First, as shown in FIG. 15, a plurality of light emitting diodes 52 are densely formed on a principal plane of a first substrate 51. A size of the light emitting diode 52 is set to a value being as small as possible, for example, about 20 µm for one side. The first substrate 51, which is made from a material having a high transmittance for a wavelength of a laser beam used to irradiate the light emitting diode 52, is typically configured as a sapphire substrate. The light emitting diode 52 is already provided with a p-electrode and the like but is not subjected to final wiring. Device isolation grooves 52g are formed, to make the light emitting diodes 52 isolatable from each other. The grooves 52g are formed, for example, by reactive ion etching.

The light emitting diodes 52 on the first substrate 51 are then transferred to a first temporarily holding member 53. The first temporarily holding member 53 may be selected from a glass substrate, a quartz glass substrate, and a plastic substrate. In this embodiment, the quartz glass substrate used. A peelable layer 54 functioning as a release layer is formed on the surface of the first temporarily holding member 53. The peelable layer 54 may be made from a fluorine coat material, a silicone resin, a water soluble adhesive (for example, polyvinyl alcohol: PVA), or polyimide. In this embodiment, the peelable layer 54 is made from polyimide.

Upon transfer, as shown in FIG. 15, the surface of the first substrate 51 is coated with an adhesive (for example, ultraviolet (UV)-curing type adhesive) 55 in an amount large enough to cover the light emitting diodes 52, and then the first temporarily holding member 53 is overlapped to the first substrate 51 in such a manner as to be supported by the light emitting diodes 52. In such a state, the adhesive 55 is irradiated with ultraviolet rays (UV) from the back side of the first temporarily holding member 53, to be cured. The first temporarily holding member 53, which is made from quartz glass, allows ultraviolet rays to pass therethrough, so that the adhesive 55 can be readily cured by irradiation of the ultraviolet rays having passed through the first temporarily holding member 53.

At this time, since the first temporarily holding member 53 is supported by the light emitting diodes 52, the gap between the first substrate 51 and the first temporarily holding member 53 is determined by the height of the light emitting diodes 52. Accordingly, in the case of curing the adhesive 55 in the state that the first temporarily holding member 53 is overlapped to the first substrate 51 in such a manner as to be supported by the light emitting diodes 52, the thickness, denoted by character "t", of the adhesive 55 is limited by the gap between the first substrate 51 and the first temporarily holding member 53, that is, the height of the light emitting diodes 52. In other words, the light emitting diodes 52 on the first substrate 51 function as a spacer to allow the formation of the adhesive layer having a specific thickness between the first substrate 51 and the first temporarily holding member 53. In this way, according to the adhesive layer forming method in this embodiment, since the thickness of an adhesive layer is determined by the height of the light emitting diodes 52, it is possible to form the adhesive layer having a specific thickness without strictly controlling the pressure applied thereto.

Figure 17:
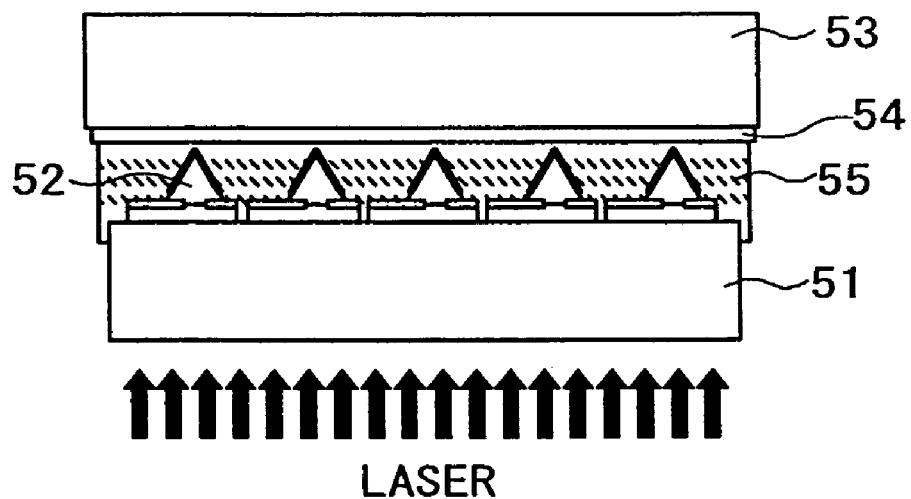
FIG. 17 is a schematic sectional view showing a laser abrasion step.

After the adhesive 55 is cured, as shown in FIG. 17, the light emitting diodes 52 are irradiated with laser beams from the back side of the first substrate 51, to be peeled from the first substrate 51 by making use of laser abrasion. Since the GaN based light emitting diode 52 is decomposed into gallium (Ga) and nitrogen at an interface between the GaN layer and sapphire, the light emitting diode 52 can be relatively simply peeled from the first substrate 51 made from sapphire. The laser beam used to irradiate the light emitting diode 52 may be selected from an excimer laser beam, a harmonic YAG laser beam, and the like. The light emitting diodes 52, each of which has been peeled from the first substrate 51 at the interface between the GaN layer and the first substrate 51 by laser abrasion, are then transferred to the first temporarily holding member 53 in a state being buried in the adhesive 55.

Figure 18:
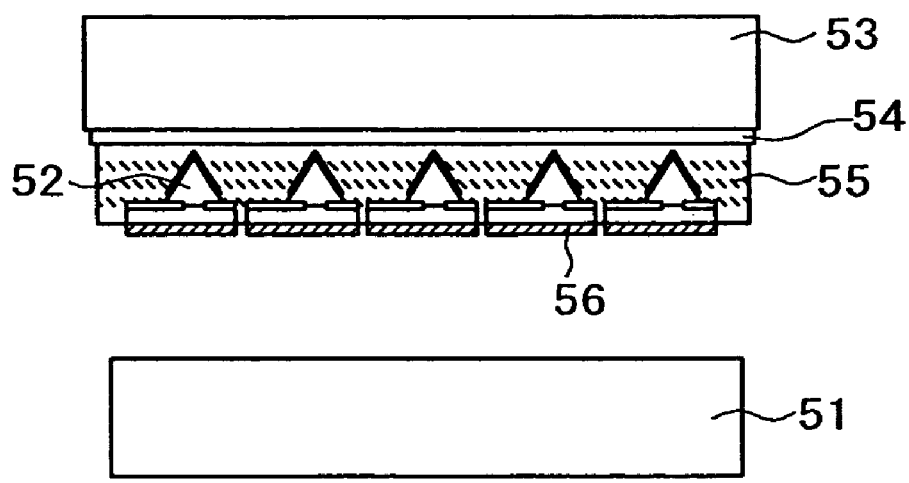
FIG. 18 is a schematic sectional view showing a first substrate separating step.
Figure 19:
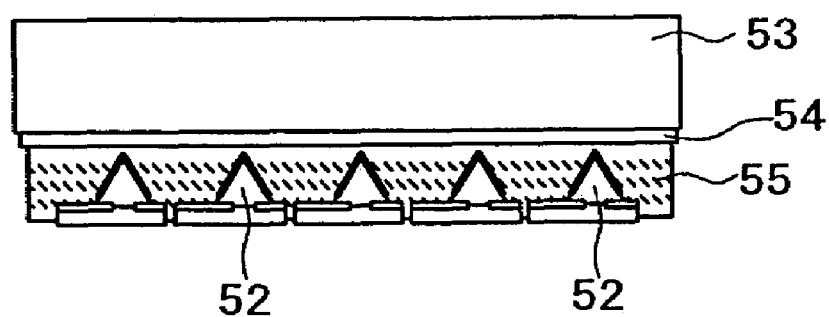
FIG. 19 is a schematic sectional view showing a Ga removing step.
Figure 20:
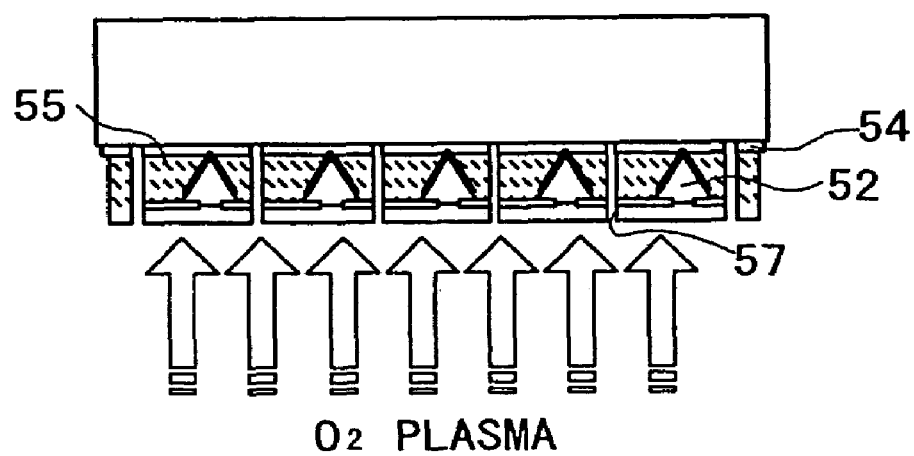
FIG. 20 is a schematic sectional view showing a device isolation groove forming step.

FIG. 18 shows a state after the first substrate 51 is removed by the above-described peeling. At this time, since the GaN based light emitting diodes 52 have been peeled from the first substrate 51 made from sapphire by laser abrasion, gallium (Ga) 56 is precipitated on the peeled plane. Such deposited gallium (Ga) must be removed by etching. Concretely, as shown in FIG. 19, gallium (Ga) 56 is removed by wet etching using a water solution containing NaOH or diluted nitric acid. Subsequently, as shown in FIG. 20, the peeled plane is further cleaned by oxygen plasma ($O_2$ plasma), and thereafter, dicing grooves 57 are formed in the adhesive 55 by dicing so as to isolate the light emitting diodes 52 from each other. The light emitting diodes 52 will be selectively separated from the first temporarily holding member 53 as described later. The dicing process can be performed by a usual blade. Alternatively, if a narrow cut-in-depth of about 20 μm or less is required, laser cutting using the above-described laser beam may be performed. The cut-in-depth is dependent on a size of each light emitting diode 52 covered with the adhesive 55 within a pixel of an image display unit, and as one example, the grooves are formed by using an excimer laser beam, to form each of the light emitting diodes 52 into a specific shape, thereby forming a chip.

The selective separation of the light emitting diodes 52 is performed as follows.

Figure 21:
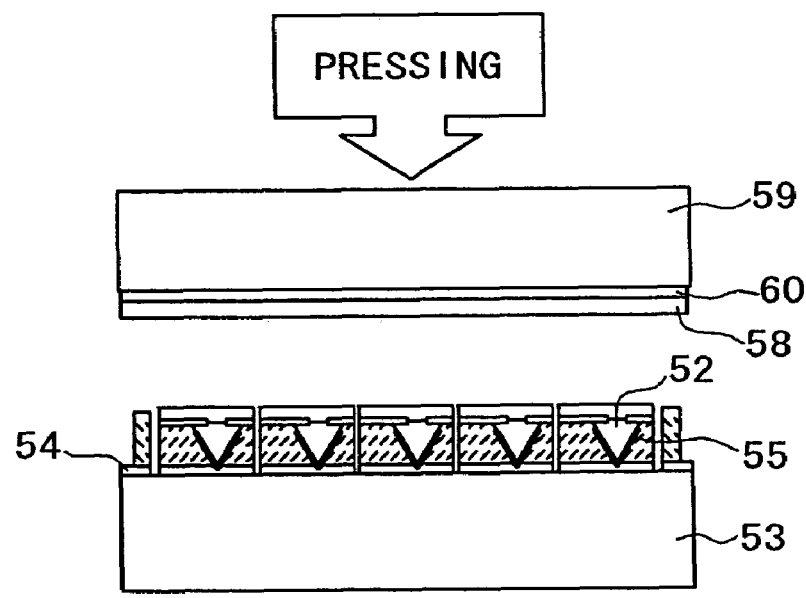
FIG. 21 is a schematic sectional view showing a second temporarily holding member joining step.

As shown in FIG. 21, the cleaned light emitting diodes 52 are coated with a thermoplastic adhesive 58, and a second temporarily holding member 59 is overlapped to the adhesive 58. Like the first temporarily holding member 53, the second temporarily holding member 59 may be made from glass, quartz glass, or plastic, and in this embodiment, the second temporarily holding member 59 is made from quartz glass. A peelable layer 60 made from polyimide is also formed on the surface of the second temporarily holding member 59.

Figure 22:
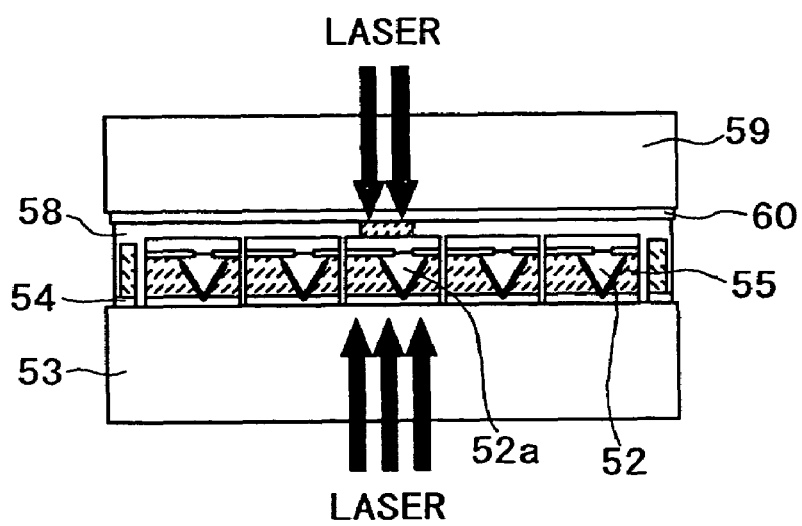
FIG. 22 is a schematic sectional view showing a selective laser abrasion/UV-exposure step.
Figure 23:
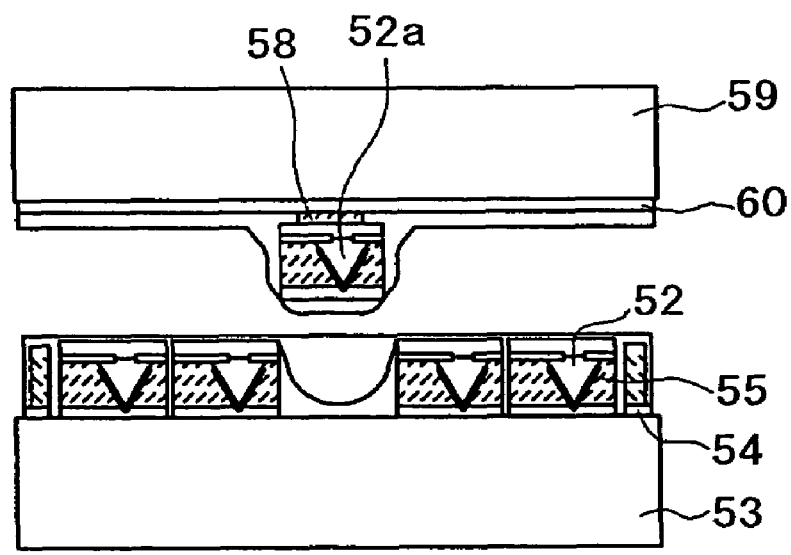
FIG. 23 is a schematic sectional view showing a light emitting diode selectively separating step.

As shown in FIG. 22, only a portion, corresponding to a light emitting diode 52a to be transferred, of the first temporarily holding member 53 is irradiated with laser beams from the back side of the first temporarily holding member 53, whereby the light emitting diode 52a is peeled from the first temporarily holding member 53 by laser abrasion. At the same time, a portion, corresponding to the light emitting diode 52a to be transferred, of the thermoplastic adhesive 58 of the second temporarily holding member 59 is irradiated with visible rays or infrared laser beams from the back side of the second temporarily holding member 59, whereby the irradiated portion of the thermoplastic adhesive 58 is once melted and cured. As a result, when the second temporarily holding member 59 is peeled from the first temporarily holding member 53, only the light emitting diode 52a to be transferred is selectively separated from the first temporarily holding member 53 as shown in FIG. 23 and is transferred to the second temporarily holding member 59.

Figure 24:
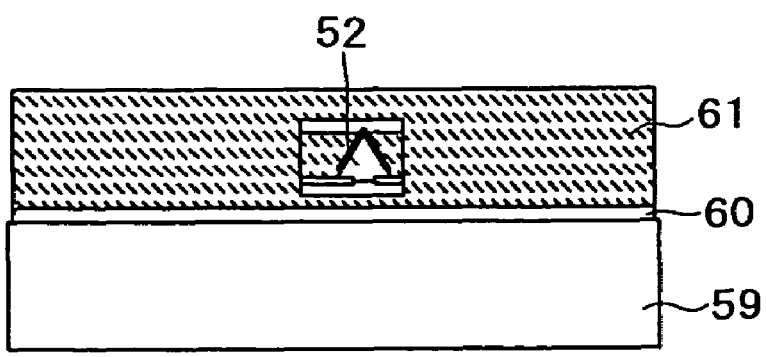
FIG. 24 is a schematic sectional view showing a burying step for burying the device in a resin.
Figure 25:
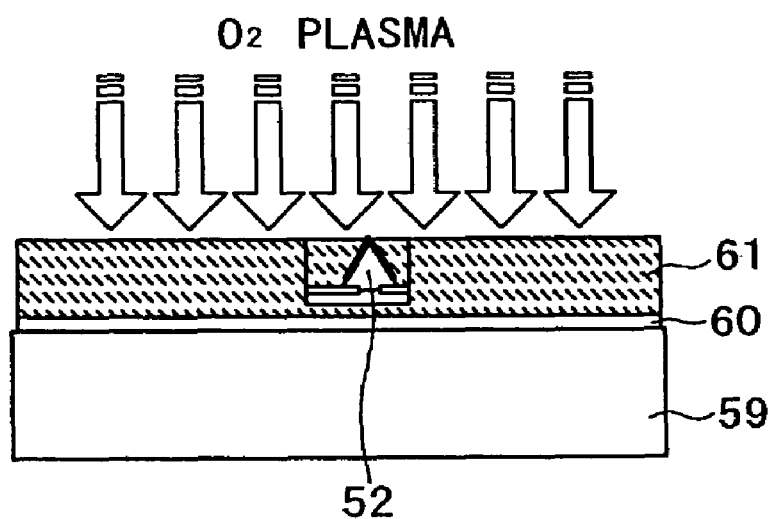
FIG. 25 is a schematic sectional view showing a resin layer thickness reducing step.
Figure 26:
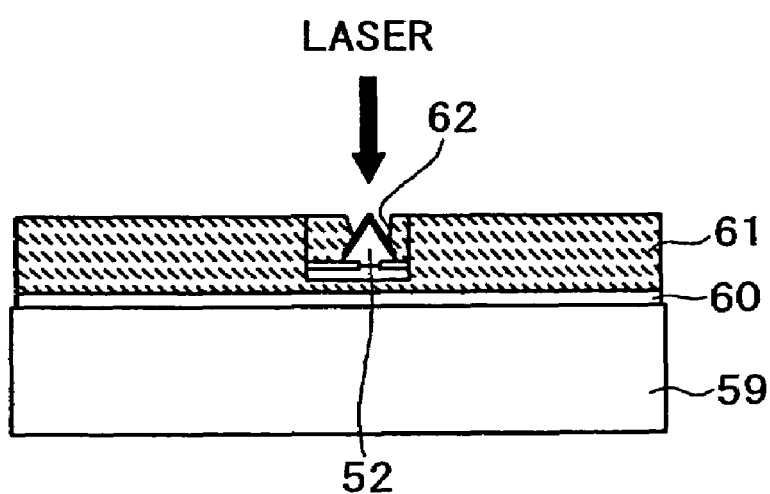
FIG. 26 is a schematic sectional view showing a via-hole forming step.

After the above-described selective separation, as shown in FIG. 24, a resin is applied to cover the transferred light emitting diode 52, to form a resin layer 61. Subsequently, as shown in FIG. 25, the thickness of the resin layer 61 is reduced by oxygen plasma or the like, and as shown in FIG. 26, a via-hole 62 is formed at a portion, corresponding to the light emitting diode 52, of the resin layer 61 by laser irradiation. The formation of the via-hole 62 may be performed by using an excimer laser beam, a harmonic YAG laser beam, or a carbon dioxide laser beam. The diameter of the via-hole 62 is typically set to a value ranging from about 3 to 7 μm.

Figure 27:
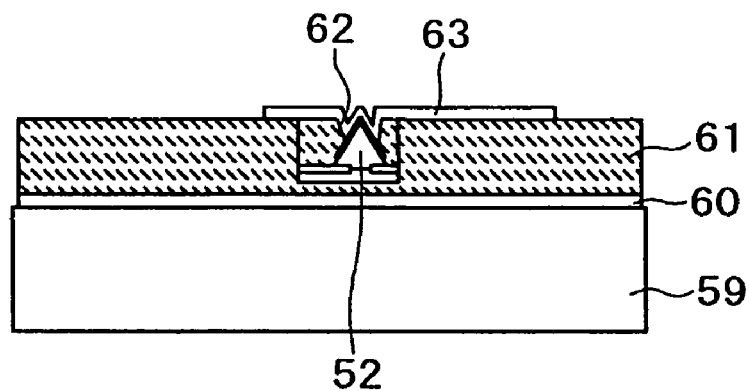
FIG. 27 is a schematic sectional view showing an anode side electrode pad forming step.

An anode side electrode pad 63 is formed so as to be connected to a p-electrode of the light emitting diode 52 through the via-hole 62. The anode side electrode pad 63 is typically made from Ni/Pt/Au. FIG. 27 shows a state that after the light emitting diode 52 is transferred to the second temporarily holding member 59, the via-hole 62 is formed in the portion, on the anode electrode (p-electrode) side, of the resin layer 61, and then the anode side electrode pad 63 is formed on the resin layer 61 so as to be buried in the via-hole 62.

A portion, being in contact with the light emitting diode 52, of the electrode pad 63 thus formed is then converted into an ohmic contact to the light emitting diode 52 by making use of the alloying method according to the present invention.

To be more specific, after the electrode pad 63 is formed, only a portion, being in contact with the light emitting diode 52, of the electrode pad 63 is selectively irradiated with laser beams, for example, YAG laser beams (wavelength: 532 nm), to be alloyed with the light emitting diode 52, whereby the portion, being in contact with the light emitting diode 52, of the electrode pad 63 is converted into an ohmic contact to the light emitting diode 52. At this time, since the light emitting diode 52 remains as transferred to the second temporarily holding member 59 in a state being buried in the resin layer 61 and the like, the portion, being in contact with the light emitting diode 52, of the electrode pad 63 can be alloyed with the light emitting diode 52 by irradiation of laser beams having a low irradiation energy, to be thus converted into a desirable ohmic contact without giving any damage to the light emitting diode 52.

Figure 28:
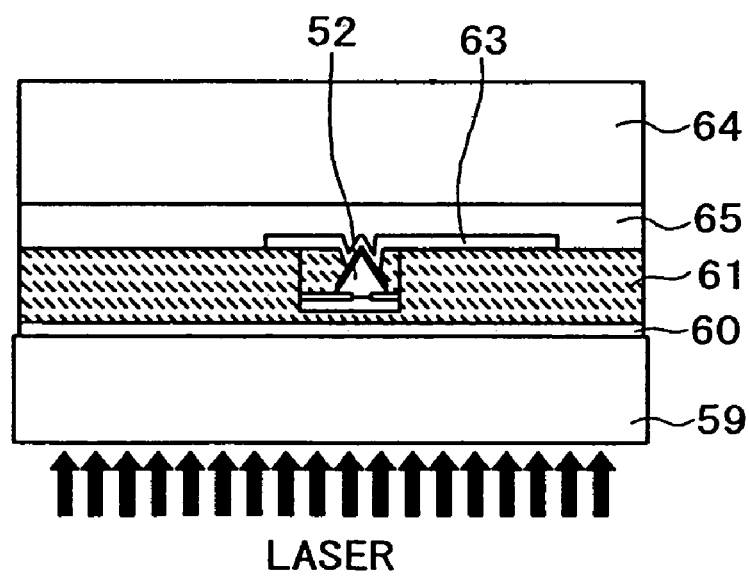
FIG. 28 is a schematic sectional view showing a laser abrasion step.
Figure 29:
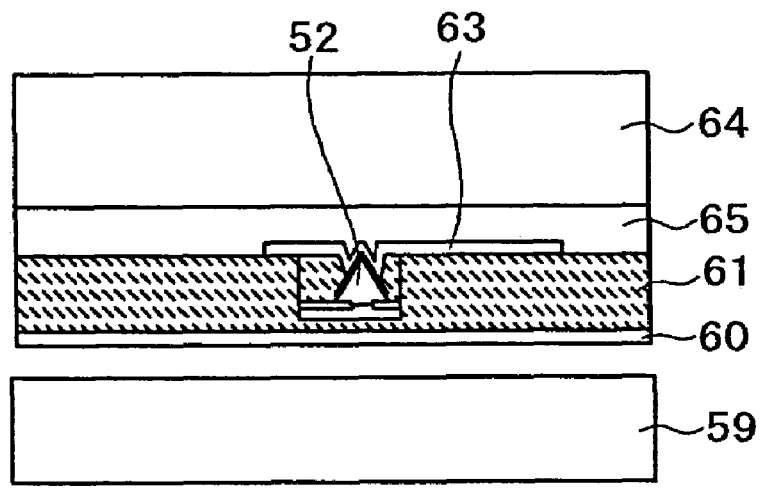
FIG. 29 is a schematic sectional view showing a second temporarily holding member separating step.

After the anode side electrode pad 63 is formed, the light emitting diode 52 is transferred to a third temporarily holding member 64 for forming a cathode side electrode on a surface, on the side opposed to the side provided with the anode side electrode pad 63, of the light emitting diode 52. The third temporarily holding member 64 is typically made from quartz glass. Before transfer, as shown in FIG. 28, an adhesive 65 is applied to cover the light emitting diode 52 provided with the anode side electrode pad 63 and the resin layer 61, and then the third temporarily holding member 64 is stuck on the adhesive 65. In such a state, laser irradiation is performed from the back side of the second temporarily holding member 59, whereby peeling by laser abrasion occurs at an interface between the second temporarily holding member 59 made from quartz glass and the peelable layer 60 made from polyimide on the second temporarily holding member 59. As a result, the light emitting diode 52 and the resin layer 61 formed on the peelable layer 60 are transferred to the third temporarily holding member 64. FIG. 29 shows the state after the second temporarily holding member 59 is separated from the light emitting diode 52 and the resin layer 61.

Figure 30:
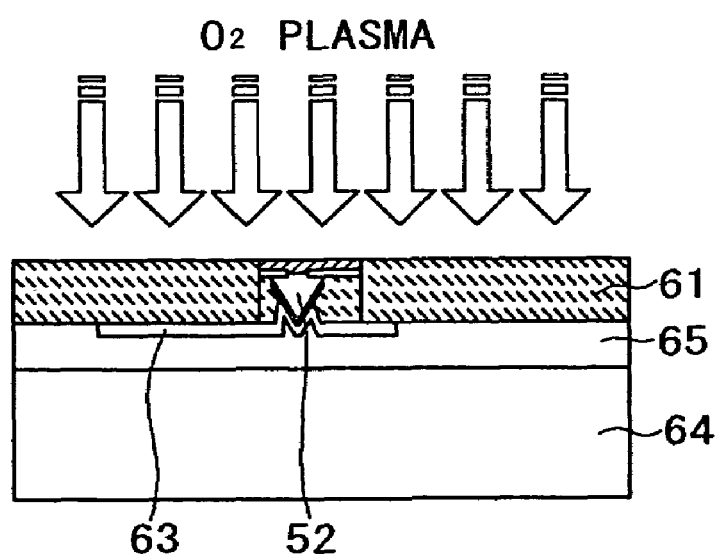
FIG. 30 is a schematic sectional view showing an exposure step for exposing a semiconductor layer to be connected to an electrode pad.

The formation of the cathode side electrode will be performed as follows. After the above-described transfer step is terminated, as shown in FIG. 30, the peelable layer 60 and an excessive portion of the resin layer 61 are removed by $O_2$ plasma until a contact semiconductor layer (n-electrode) of the light emitting diode 52 is exposed. In the state that the light emitting diode 52 is held by the adhesive 65 of the third temporarily holding member 64, the back side of the light emitting diode 52 is taken as the n-electrode side (cathode electrode side), and accordingly, by forming an electrode pad 66 as shown in FIG. 31, the electrode pad 66 is electrically connected to the n-electrode on the back surface of the light emitting diode 52.

A portion, being in contact with the light emitting diode 52, of the electrode pad 66 is also converted into an ohmic contact to the light emitting diode 52 by making use of the alloying method according to the present invention. To be more specific, after the electrode pad 66 is formed, only a portion, being in contact with the light emitting diode 52, of the electrode pad 66 is selectively irradiated with laser beams, for example, YAG laser beams (wavelength: 532 nm), to be thus alloyed with the light emitting diode 52.

The size of the cathode side electrode pad 66 is typically set to about 60 μm square. The electrode pad 66 may be made from a transparent material (ITO or ZnO) or Ti/Al/Pt/Au. In the case of using the transparent electrode, even if the electrode pad covers a large area of the back surface of the light emitting diode 52, it does not block light emission, and accordingly, the size of the electrode pad can be increased and also the patterning accuracy can be made rough, to facilitate the patterning process.

The light emitting diodes 52 buried in the resin layer 61 and the adhesive 65 are then individually cut into the above-described resin-covered chips by laser dicing or the like. FIG. 32 shows the step of cutting the light emitting diodes 52 by laser dicing. The laser dicing is performed by using a line-shaped laser beam so as to cut the resin layer 61 and the adhesive 65 until the third temporarily holding member 64 is exposed. The light emitting diodes 52 are cut into the resin-covered chips each having a specific size by laser dicing, and are carried to a mounting step to be described later.

Figure 33:
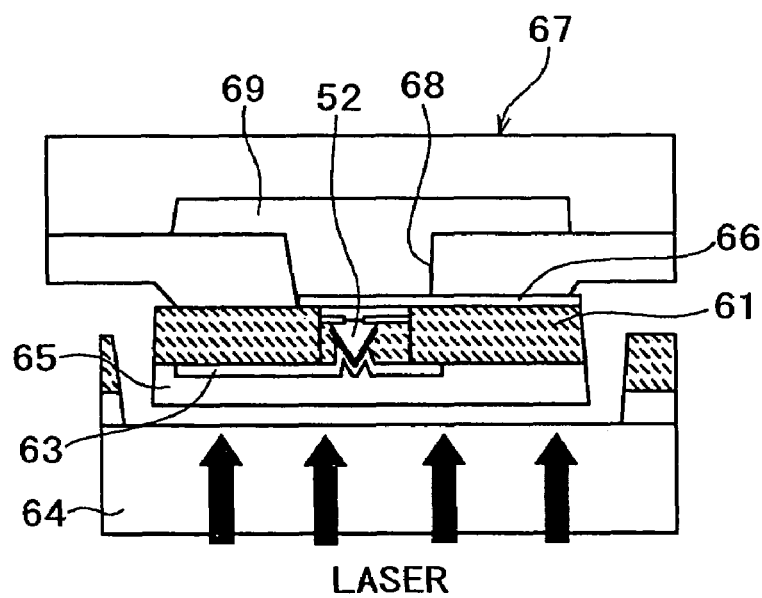
FIG. 33 is a schematic sectional view showing a pick-up step for selectively picking up the devices by an attracting device.

In the mounting step, each light emitting diode 52 in the form of the resin-covered chip is peeled from the third temporarily holding member 64 by combination of mechanical means (attraction of the device by vacuum suction) and laser abrasion. FIG. 33 shows a state that one of the light emitting diodes 52 arrayed on the third temporarily holding member 64 is picked up by an attracting device 67. The attracting device 67 has attracting holes 68 opened in a matrix corresponding to a pixel pitch of an image display unit in order to collectively attract a number of the light emitting diodes 52. The attracting holes 68, each having an opening diameter of about 100 μm, are arranged in a matrix with a pitch of 600 μm. Accordingly, the attracting device 67 can collectively attract 300 pieces of the light emitting diodes 52. A member in which the attracting holes 68 are to be formed may be produced from Ni by electrocasting, or formed of a plate made from a metal such as a stainless steel (SUS), and the attracting holes 68 are formed in the member by etching. An attracting chamber 69 is formed at the depth of the attracting hole 68. By making the pressure in the attracting chamber 69 negative, the attracting device 67 can attract the light emitting diode 52. Since each light emitting diode 52 is in a state being covered with the adhesive layer 61 whose surface is nearly flatted, the light emitting diode 52 can be easily, selectively attracted by the attracting device 67.

Figure 34:
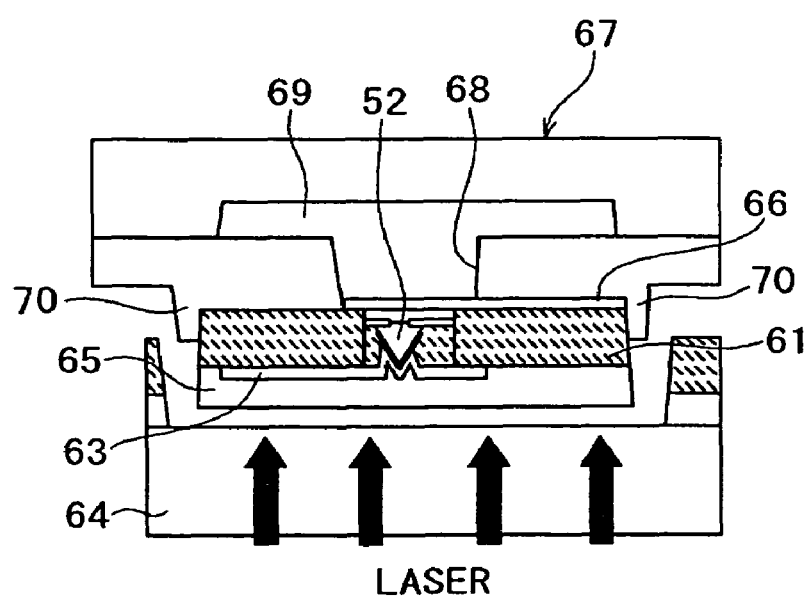
FIG. 34 is a schematic sectional view showing one example of the attracting device provided with a device position displacement preventing means.

To stably hold, at the time of attraction of the light emitting diode 52 (resin-covered chip) by vacuum suction, the diode 52 at a specific position, the attracting device 67 is preferably provided with device position displacement preventing means. FIG. 34 shows one example of the attracting device 67 provided with device position displacement preventing means 70. In this embodiment, the device position displacement preventing means 70 is formed as a positioning pin which is brought into contact with a peripheral surface of the resin-covered chip. By bringing the positioning pin into contact with the peripheral surface of the resin-covered chip (more concretely, the cut plane of the resin layer 61 cut by laser dicing), the resin-covered chip (that is, the light emitting diode 52) is accurately positioned to the attracting device 67. The cut plane of the resin layer 61 cut by laser dicing is not a perfectly vertical plane but is a plane having a taper of 5 to 10 degrees with respect to the vertical plane. Accordingly, the positioning pin (device position displacement preventing means 70) may be designed to have the same taper. With the use of the positioning pin having the taper, even if a slight positional displacement occurs between the light emitting diode 52 and the attracting device 67, such a positional displacement can be readily corrected.

The peeling of the light emitting diode 52 can be smoothly performed by combination of the attraction of the device 52 by the attracting device 67 and peeling of the resin-covered chip by laser abrasion. The laser abrasion is performed by irradiation of laser beams from the back side of the third temporarily holding member 64, to cause peeling at an interface between the third temporarily holding member 64 and the adhesive 65.

Figure 35:
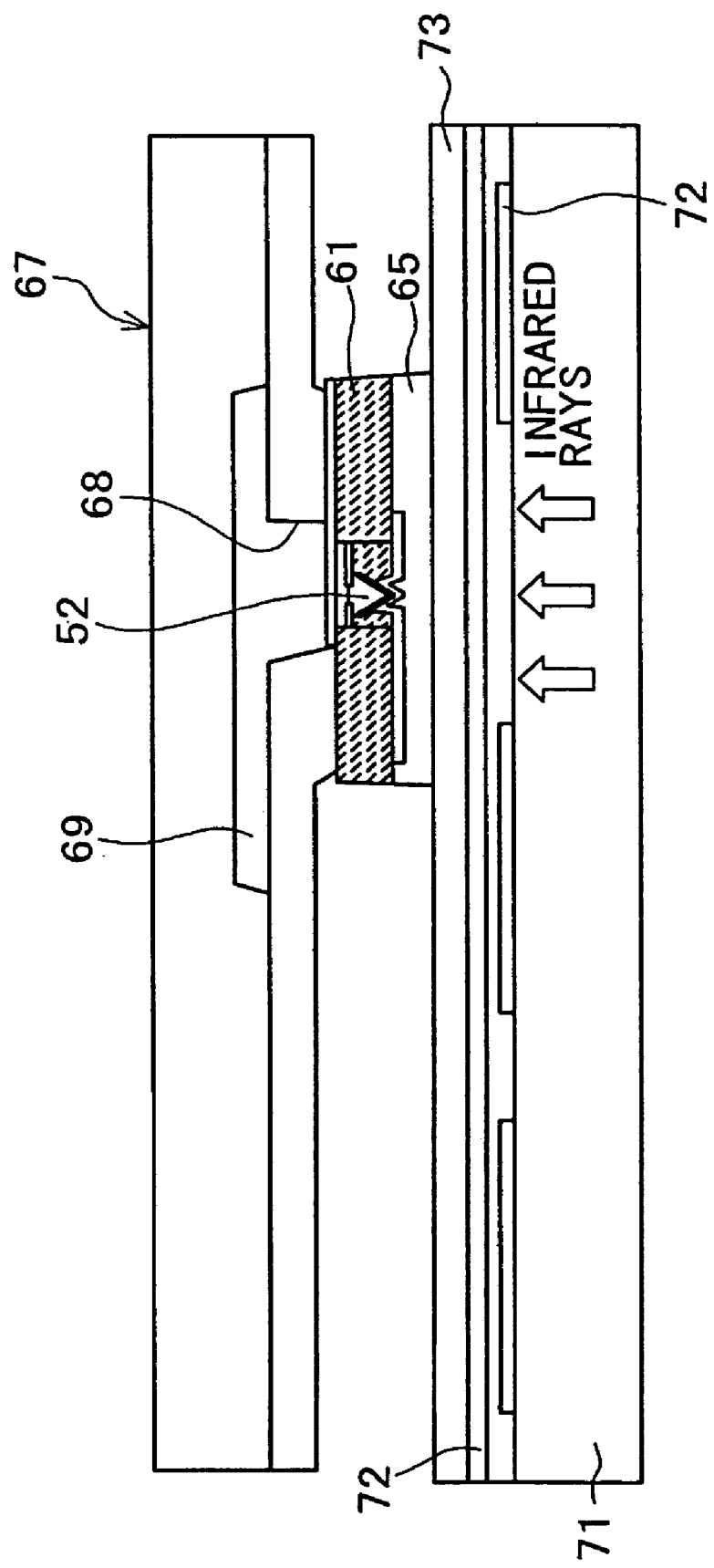
FIG. 35 is a schematic sectional view showing a transfer step of transferring the device to a second substrate.

FIG. 35 is a view showing the transfer of the light emitting diode 52 to a second substrate 71. The second substrate 71 is a wiring substrate having a wiring layer 72. Before transfer of the light emitting diodes 52 to the second substrate 71, an adhesive layer 73 is formed on the second substrate 71. By curing a portion, located under the light emitting diode 52 to be transferred, of the adhesive layer 73, the light emitting diode 52 can be fixedly arrayed on the second substrate 71. At the time of this mounting, the pressure of the attracting chamber 69 of the attracting device 67 becomes high, to release the attraction of the light emitting diode 52 to the attracting device 67. The adhesive layer 73 is made from an UV-curing type adhesive, a thermosetting adhesive, or a thermoplastic adhesive. In addition, the light emitting diodes 52 thus arrayed on the second substrate 71 are spaced from each other with a pitch larger than a pitch of the light emitting diodes 52 held on the third temporarily holding member 64. The energy for curing the resin of the adhesive layer 73 is given from the back side of the second substrate 71. Only a portion, located under the light emitting diode 52 to be transferred, of the adhesive layer 73 may be cured to be bonded to the adhesive layer 73 by irradiation of ultraviolet rays if the adhesive layer 73 is made from an UV-curing type adhesive, or by heating with the aid of infrared rays if the adhesive layer 73 is made from a thermosetting adhesive; or may be melted to be bonded to the adhesive layer 73 by irradiation of infrared rays or laser beams if the adhesive layer 73 is made from a thermoplastic adhesive.

Figure 36:
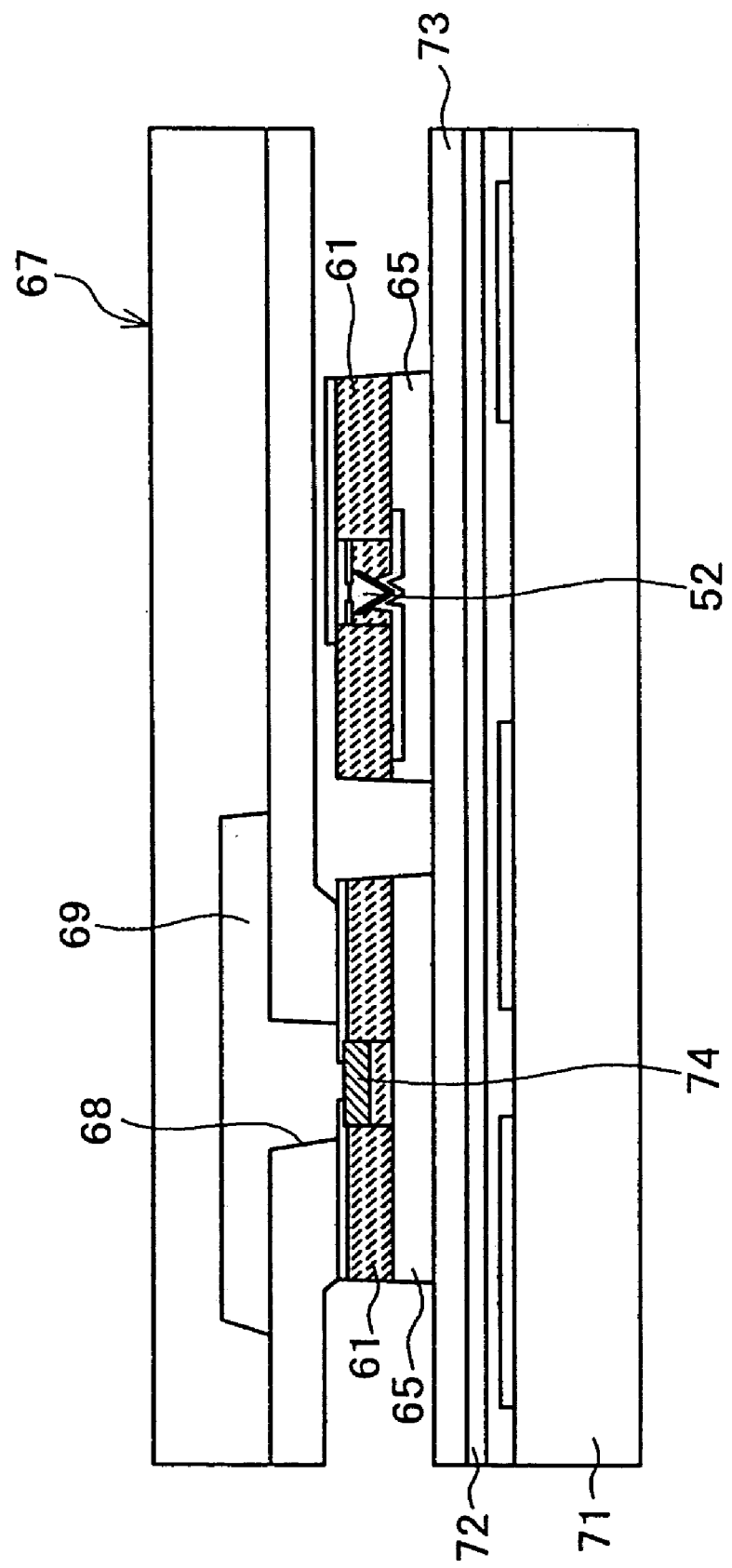
FIG. 36 is a schematic sectional view showing a transfer step of transferring another kind of light emitting diode to the second substrate.

FIG. 36 is a view showing a process of arraying another light emitting diode 74 on the second substrate 71. By mounting the light emitting diodes of a plurality of colors on the second substrate 71 at respective positions corresponding to the colors by means of the attracting device 67 shown in FIG. 33 or 34, a pixel composed of the light emitting diodes of the plurality of colors can be formed with a pixel pitch fixed. The shapes of the light emitting diodes 52 and 74 are not necessarily identical to each other. In the example shown in FIG. 36, the red light emitting diode 74 has a planar structure including no hexagonal pyramid shaped GaN layer and is different in shape from the other light emitting diode 52; however, in this stage, each of the light emitting diodes 52 and 74 has been already covered with the resin layer 61 and the adhesive 65 to be thus formed into a resin-covered chip, and therefore, the light emitting diodes 52 and 74 can be handled in the same manner irrespective of the difference in device structure therebetween.

Figure 37:
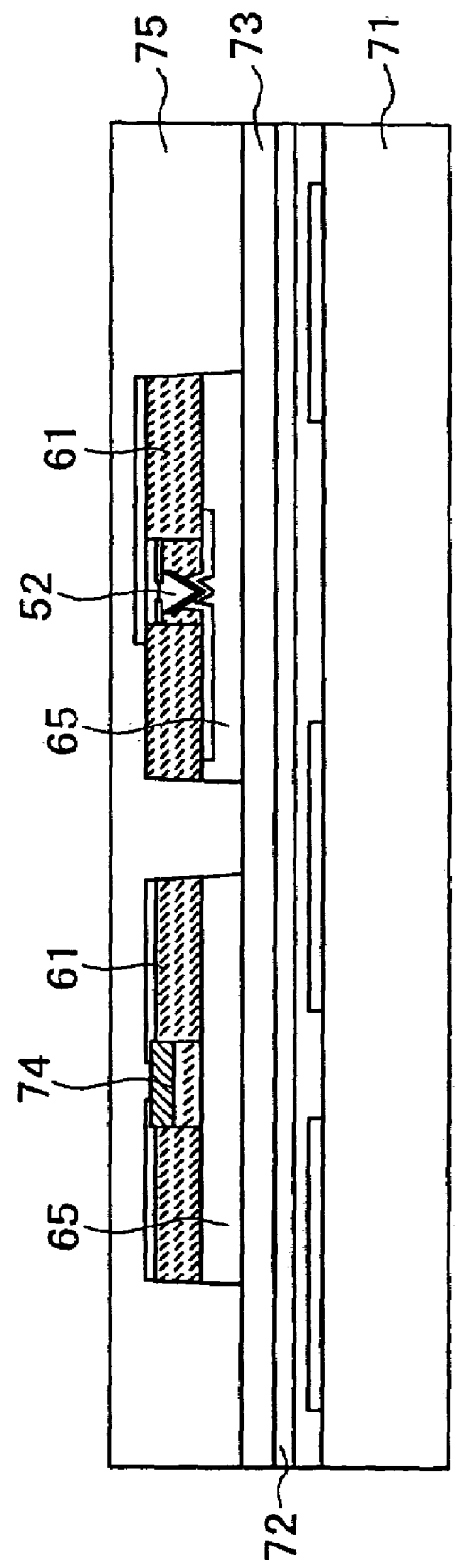
FIG. 37 is a schematic sectional view showing an insulating layer forming step.

As shown in FIG. 37, an insulating layer 75 is formed in such a manner as to cover the light emitting diodes 52 and 74 each of which is in the form of the resin-covered chip. The insulating layer 75 may be made from a transparent epoxy type adhesive, an UV-curing type adhesive, or polyimide. The formation of the insulating layer 75 is followed by formation of wiring.

Figure 38:
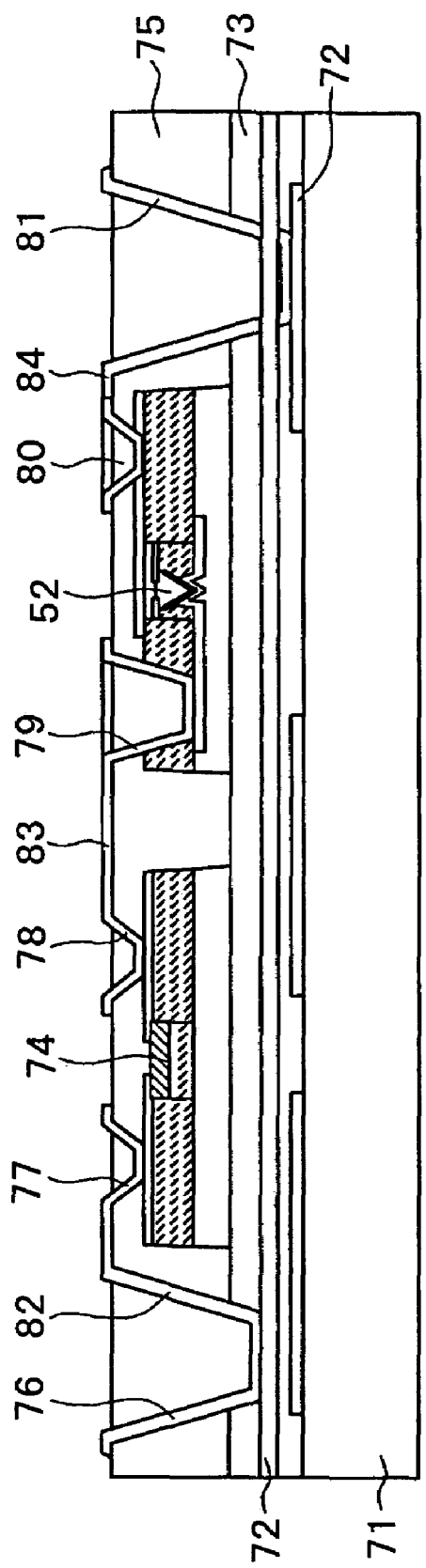
FIG. 38 is a schematic sectional view showing a wiring forming step.

FIG. 38 is a view showing a wiring forming step, in which openings 76, 77, 78, 79, 80, and 81 are formed in the insulating layer 75, and wiring lines 82, 83, and 84 for connecting electrode pads for anodes and cathodes of the light emitting diodes 52 and 74 to the wiring layer 72 of the second substrate 71 are formed. Since the areas of the electrode pads of the light emitting diodes 52 and 74 are large, the shapes of the openings, that is, via-holes can be made large, with a result that the positioning accuracy of each via-hole may be made rough as compared with a via-hole directly formed in each light emitting diode. For example, since each of the electrode pads has a size of about 60 μm square as described above, the via-hole having a diameter of about 20 μm can be formed. The via-holes are of three kinds connected to the wiring substrate, the anode electrode, and the cathode electrode. The depth of each via-hole is optimized by controlling a pulse number of a laser beam depending on the kind of the via-hole.

Figure 39:
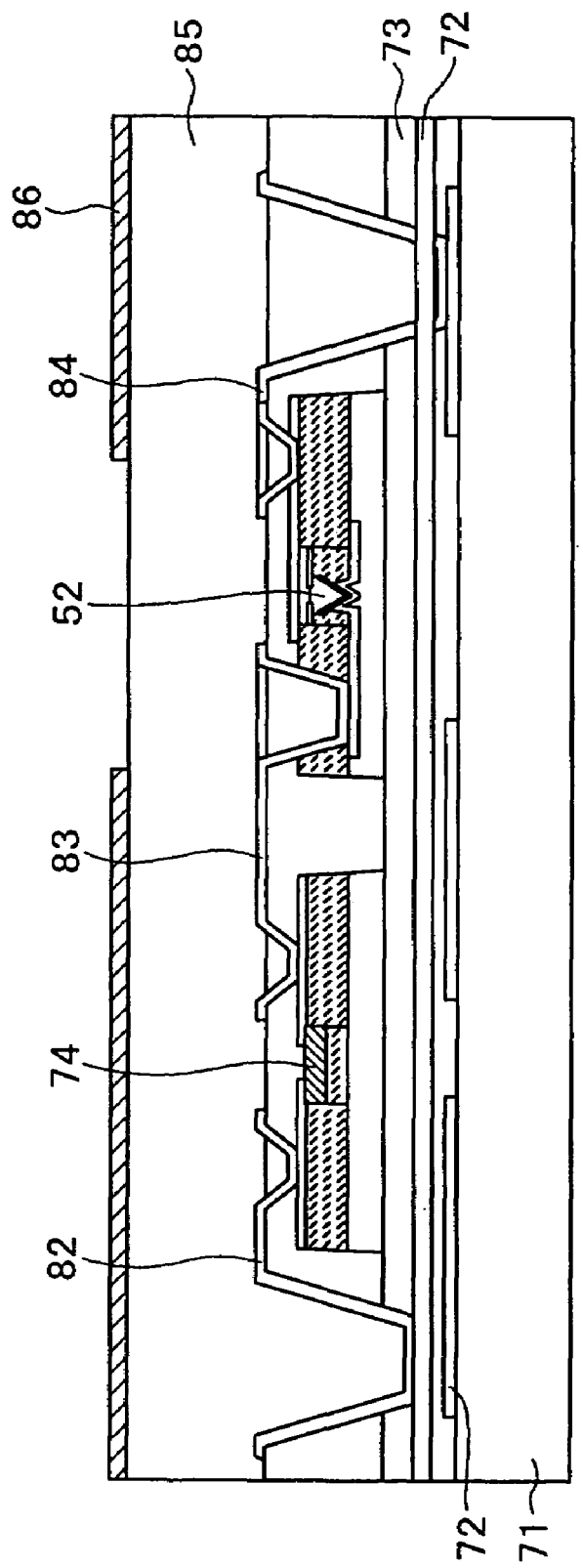
FIG. 39 is a schematic sectional view showing a final step of forming a protective layer and a black mask.

After the wiring in the above-described wiring step is terminated, as shown in FIG. 39, a protective layer 85 and a black mask 86 are formed, to accomplish a panel of an image display unit. The protective layer 85 may be made from the transparent epoxy adhesive used for the insulating layer 75 shown in FIG. 37. The protective layer 85 is heated to be cured, to perfectly cover the wiring. After that, a driver IC is connected to the wiring at the end portion of the panel, to produce a drive panel.

In the above-described method of arraying light emitting devices, since the light emitting diodes 52 are already enlargedly spaced from each other on each of the temporarily holding member 59 and 64, the relatively large electrode pads 63 and 66 can be each provided by making use of the large distance between adjacent two of the devices 52, and since the wiring is performed by making use of the relatively large electrode pads 63 and 66, even if the size of the final unit is significantly larger than the device size, the wiring can be easily formed. Also, according to the method of arraying light emitting devices in this embodiment, since each light emitting diode 52 is covered with the cured resin layer 61 whose surface is flattened, the electrode pads 63 and 66 can be accurately formed on the flattened front and back surfaces of the resin layer 61 and can be also disposed so as to extend to a region wider than the device size, with a result that the handling of the light emitting diode 52 by the attracting jig in the second transfer step can be facilitated.

As described above, according to the alloying method and wiring forming method in accordance with the present invention, it is possible to readily alloy only a necessary portion of a metal layer with a semiconductor device by laser irradiation, thereby converting the necessary portion into an ohmic contact without degrading characteristics of the semiconductor device, and since the energy of laser beams used to irradiate the above necessary portion can be set to a low value, it is possible to enhance the throughput, for example, by increasing an irradiated area, and hence to significantly reduce the production cost.

According to the display device forming method in accordance with the present invention, it is possible to fabricate a reliable display device having a structure including light emitting devices modularized in the form of resin-covered chips on which desirable electrodes can be formed and which are allowed to be easily carried and easily mounted to a base body. Also, it is possible to provide a method of fabricating an image display unit having an excellent performance at a high productivity and a low cost by applying the above-described alloying method, wiring forming method, and display device forming method according to the present invention.

While the preferred embodiments of the present invention have been described using the specific terms, such description is for illustrative purposes only, and it is to be understood that changes and variations may be made without departing from the sprit and scope of the following claims.

What is claimed is:

1. A method of fabricating an image display unit in which display devices in the form of chips obtained by burying light emitting devices in a resin are arrayed in a matrix, said method comprising:

a first transfer step of transferring light emitting devices having been arrayed on a first substrate to a temporary holding member such that said devices are spaced farther apart than said first substrate, a second transfer step of transferring the light emitting devices having been held on the temporary holding member to a second substrate such that said devices are spaced farther apart than said temporary holding member; and a wiring forming step of forming a wiring portion connected to each of the light emitting devices;

wherein said method further comprises:

an electrode forming step of forming, after each of the light emitting devices is buried in a resin, an electrode composed of a metal layer on the surface of the resin; and an alloying step of alloying an interface between the light emitting device and the electrode by irradiating the light emitting device and the electrode with a laser beam having a wavelength absorbable in at least one of the light emitting device and the electrode, and wherein the laser beam is a pulse YAG laser beam.

* * * * *